(12) United States Patent
Kogut et al.

(10) Patent No.: US 7,742,220 B2
(45) Date of Patent: Jun. 22, 2010

(54) MICROELECTROMECHANICAL DEVICE AND METHOD UTILIZING CONDUCTING LAYERS SEPARATED BY STOPS

(75) Inventors: Lior Kogut, Haifa (IL); Ming-Hau Tung, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 273 days.

(21) Appl. No.: 11/692,734

(22) Filed: Mar. 28, 2007

(65) Prior Publication Data
US 2008/0239455 A1 Oct. 2, 2008

(51) Int. Cl.
G02B 26/00 (2006.01)
(52) U.S. Cl. .................. 359/292; 359/291; 359/224
(58) Field of Classification Search .................. 359/290, 359/291, 293, 295, 298, 220, 222, 223, 224, 359/320, 323, 324, 245, 254
See application file for complete search history.

(56) References Cited

U.S. PATENT DOCUMENTS

| | | | |
|---|---|---|---|
| 3,728,030 | A | 4/1973 | Hawes |
| 3,955,190 | A | 5/1976 | Teraishi |
| 4,403,248 | A | 9/1983 | te Velde |
| 4,441,791 | A | 4/1984 | Hornbeck |
| 4,786,128 | A | 11/1988 | Birnbach |
| 4,859,060 | A | 8/1989 | Katagiri et al. |
| 4,954,789 | A | 9/1990 | Sampsell |
| 4,956,619 | A | 9/1990 | Hornbeck |
| 4,982,184 | A | 1/1991 | Kirkwood |
| 5,022,745 | A | 6/1991 | Zahowski et al. |
| 5,028,939 | A | 7/1991 | Hornbeck et al. |

(Continued)

FOREIGN PATENT DOCUMENTS

EP 0 668 490 8/1995

(Continued)

OTHER PUBLICATIONS

Pape et al., Characteristics of the deformable mirror device for optical information processing, Optical Engineering, 22(6):676-681, Nov.-Dec. 1983.

(Continued)

Primary Examiner—Ricky L Mack
Assistant Examiner—Tuyen Q Tra
(74) Attorney, Agent, or Firm—Knobbe, Martens, Olson & Bear, LLP

(57) ABSTRACT

A microelectromechanical system (MEMS) device includes a reflective element that includes at least one stop member. The device also includes an electrode and an aperture that extends at least partially through the electrode. The aperture has a boundary. The device has an electrically nonconductive surface within the aperture or on a portion of the boundary of the aperture. A support structure separates the reflective element from the electrode. The reflective element can be moved between a first position and a second position. The stop member is spaced from the electrically nonconductive surface when the reflective element is in the first position. A portion of the stop member is in contact with the electrically nonconductive surface when the reflective element is in the second position. The reflective element and the electrode are electrically isolated from each other when the reflective element is in the second position.

31 Claims, 19 Drawing Sheets

U.S. PATENT DOCUMENTS

| | | | |
|---|---|---|---|
| 5,091,983 A | 2/1992 | Lukosz | |
| 5,096,279 A | 3/1992 | Hornbeck et al. | |
| 5,170,283 A | 12/1992 | O'Brien et al. | |
| 5,315,370 A | 5/1994 | Bulow | |
| 5,381,232 A | 1/1995 | Van Wijk | |
| 5,452,138 A | 9/1995 | Mignardi et al. | |
| 5,471,341 A | 11/1995 | Warde et al. | |
| 5,526,172 A | 6/1996 | Kanack | |
| 5,559,358 A | 9/1996 | Burns et al. | |
| 5,636,052 A | 6/1997 | Arney et al. | |
| 5,646,729 A | 7/1997 | Koskinen et al. | |
| 5,646,768 A | 7/1997 | Kaeiyama | |
| 5,661,592 A | 8/1997 | Bornstein et al. | |
| 5,665,997 A | 9/1997 | Weaver et al. | |
| 5,710,656 A | 1/1998 | Goosen | |
| 5,734,177 A | 3/1998 | Sakamoto | |
| 5,786,927 A | 7/1998 | Greywall et al. | |
| 5,808,781 A | 9/1998 | Arney et al. | |
| 5,818,095 A | 10/1998 | Sampsell | |
| 5,825,528 A | 10/1998 | Goosen | |
| 5,838,484 A | 11/1998 | Goossen et al. | |
| 5,867,302 A | 2/1999 | Fleming | |
| 5,914,804 A | 6/1999 | Goossen | |
| 5,920,418 A | 7/1999 | Shiono et al. | |
| 6,028,689 A | 2/2000 | Michalicek et al. | |
| 6,040,937 A | 3/2000 | Miles | |
| 6,055,090 A | 4/2000 | Miles | |
| 6,262,697 B1 | 7/2001 | Stephenson | |
| 6,327,071 B1 | 12/2001 | Kimura | |
| 6,356,378 B1 | 3/2002 | Huibers | |
| 6,384,952 B1 | 5/2002 | Clark et al. | |
| 6,433,917 B1 | 8/2002 | Mei et al. | |
| 6,438,282 B1 | 8/2002 | Takeda et al. | |
| 6,452,712 B2 | 9/2002 | Atobe et al. | |
| 6,466,354 B1 | 10/2002 | Gudeman | |
| 6,535,663 B1 | 3/2003 | Chertkow | |
| 6,556,338 B2 | 4/2003 | Han et al. | |
| 6,574,033 B1 | 6/2003 | Chui et al. | |
| 6,597,490 B2 | 7/2003 | Tayebati | |
| 6,608,268 B1 | 8/2003 | Goldsmith | |
| 6,632,698 B2 | 10/2003 | Ives | |
| 6,650,455 B2 | 11/2003 | Miles | |
| 6,657,832 B2 | 12/2003 | Williams et al. | |
| 6,661,561 B2 | 12/2003 | Fitzpatrick et al. | |
| 6,674,562 B1 | 1/2004 | Miles et al. | |
| 6,680,792 B2 | 1/2004 | Miles | |
| 6,698,295 B1 | 3/2004 | Sherrer | |
| 6,710,908 B2 | 3/2004 | Miles et al. | |
| 6,794,119 B2 | 9/2004 | Miles | |
| 6,813,059 B2 * | 11/2004 | Staker et al. | 359/290 |
| 6,841,081 B2 | 1/2005 | Chang et al. | |
| 6,844,959 B2 | 1/2005 | Huibers et al. | |
| 6,867,896 B2 | 3/2005 | Miles | |
| 6,870,654 B2 | 3/2005 | Lin et al. | |
| 6,882,458 B2 | 4/2005 | Lin et al. | |
| 6,882,461 B1 | 4/2005 | Tsai et al. | |
| 6,912,022 B2 | 6/2005 | Lin et al. | |
| 6,940,630 B2 | 9/2005 | Xie | |
| 6,947,200 B2 | 9/2005 | Huibers | |
| 6,952,303 B2 | 10/2005 | Lin et al. | |
| 6,958,847 B2 | 10/2005 | Lin | |
| 6,980,350 B2 | 12/2005 | Hung et al. | |
| 6,983,135 B1 | 1/2006 | Tsai | |
| 7,006,272 B2 | 2/2006 | Tsai | |
| 7,027,204 B2 | 4/2006 | Trisnadi et al. | |
| 7,034,981 B2 | 4/2006 | Makigaki | |
| 7,042,625 B2 * | 5/2006 | Hong et al. | 359/292 |
| 7,046,422 B2 | 5/2006 | Kimura et al. | |
| 7,119,945 B2 | 10/2006 | Kothari et al. | |
| 7,123,216 B1 | 10/2006 | Miles | |
| 7,126,738 B2 | 10/2006 | Miles | |
| 7,130,104 B2 | 10/2006 | Cummings | |
| 7,184,195 B2 * | 2/2007 | Yang | 359/295 |
| 7,184,202 B2 | 2/2007 | Miles et al. | |
| 7,198,500 B1 | 4/2007 | Lin et al. | |
| 7,221,495 B2 | 5/2007 | Miles et al. | |
| 7,236,284 B2 | 6/2007 | Miles | |
| 7,289,259 B2 | 10/2007 | Chui et al. | |
| 7,321,457 B2 | 1/2008 | Heald | |
| 7,372,613 B2 | 5/2008 | Chui et al. | |
| 7,372,619 B2 | 5/2008 | Miles | |
| 7,385,744 B2 | 6/2008 | Kogut et al. | |
| 7,385,762 B2 | 6/2008 | Cummings | |
| 7,629,197 B2 | 12/2009 | Luo et al. | |
| 2001/0003487 A1 | 6/2001 | Miles | |
| 2001/0028503 A1 | 10/2001 | Flanders et al. | |
| 2001/0043171 A1 | 11/2001 | Van Gorkom et al. | |
| 2002/0015215 A1 | 2/2002 | Miles | |
| 2002/0024711 A1 | 2/2002 | Miles | |
| 2002/0054424 A1 | 5/2002 | Miles | |
| 2002/0070931 A1 | 6/2002 | Ishikawa | |
| 2002/0075555 A1 | 6/2002 | Miles | |
| 2002/0126364 A1 | 9/2002 | Miles | |
| 2002/0146200 A1 | 10/2002 | Kurdle et al. | |
| 2002/0149828 A1 | 10/2002 | Miles | |
| 2003/0016428 A1 | 1/2003 | Kato et al. | |
| 2003/0035196 A1 | 2/2003 | Walker | |
| 2003/0043157 A1 | 3/2003 | Miles | |
| 2003/0053078 A1 | 3/2003 | Missey et al. | |
| 2003/0072070 A1 | 4/2003 | Miles | |
| 2003/0202265 A1 | 10/2003 | Reboa et al. | |
| 2003/0202266 A1 | 10/2003 | Ring et al. | |
| 2004/0008396 A1 | 1/2004 | Stappaerts | |
| 2004/0008438 A1 | 1/2004 | Sato | |
| 2004/0027671 A1 | 2/2004 | Wu et al. | |
| 2004/0027701 A1 | 2/2004 | Ishikawa | |
| 2004/0043552 A1 | 3/2004 | Strumpell et al. | |
| 2004/0051929 A1 | 3/2004 | Sampsell et al. | |
| 2004/0058532 A1 | 3/2004 | Miles et al. | |
| 2004/0075967 A1 | 4/2004 | Lynch et al. | |
| 2004/0076802 A1 | 4/2004 | Tompkin et al. | |
| 2004/0080035 A1 | 4/2004 | Delapierre | |
| 2004/0100594 A1 | 5/2004 | Huibers et al. | |
| 2004/0100677 A1 | 5/2004 | Huibers et al. | |
| 2004/0125281 A1 | 7/2004 | Lin et al. | |
| 2004/0125282 A1 | 7/2004 | Lin et al. | |
| 2004/0145811 A1 | 7/2004 | Lin et al. | |
| 2004/0147198 A1 | 7/2004 | Lin et al. | |
| 2004/0175577 A1 | 9/2004 | Lin et al. | |
| 2004/0184134 A1 | 9/2004 | Makigaki | |
| 2004/0207897 A1 | 10/2004 | Lin | |
| 2004/0209195 A1 | 10/2004 | Lin | |
| 2004/0217919 A1 | 11/2004 | Pichi et al. | |
| 2004/0218251 A1 | 11/2004 | Piehl et al. | |
| 2004/0240032 A1 | 12/2004 | Miles | |
| 2005/0002082 A1 | 1/2005 | Miles | |
| 2005/0003667 A1 | 1/2005 | Lin et al. | |
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0046919 A1 | 3/2005 | Taguchi et al. | |
| 2005/0046922 A1 | 3/2005 | Lin et al. | |
| 2005/0046948 A1 | 3/2005 | Lin | |
| 2005/0068627 A1 | 3/2005 | Nakamura et al. | |
| 2005/0078348 A1 | 4/2005 | Lin | |
| 2005/0168849 A1 | 8/2005 | Lin | |
| 2005/0179378 A1 | 8/2005 | Oooka et al. | |
| 2005/0195462 A1 | 9/2005 | Lin | |
| 2005/0249966 A1 | 11/2005 | Tung et al. | |
| 2006/0007517 A1 | 1/2006 | Tsai | |
| 2006/0017379 A1 | 1/2006 | Su et al. | |
| 2006/0017689 A1 | 1/2006 | Faase et al. | |
| 2006/0024880 A1 | 2/2006 | Chui et al. | |
| 2006/0065940 A1 | 3/2006 | Kothari | |

| | | |
|---|---|---|
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066935 A1 | 3/2006 | Cummings et al. |
| 2006/0066936 A1 | 3/2006 | Chui et al. |
| 2006/0067643 A1 | 3/2006 | Chui |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings |
| 2006/0077516 A1 | 4/2006 | Kothari |
| 2006/0079048 A1 | 4/2006 | Sampsell |
| 2006/0220160 A1 | 10/2006 | Miles |
| 2006/0262380 A1 | 11/2006 | Miles |
| 2006/0268388 A1 | 11/2006 | Miles |
| 2006/0274074 A1 | 12/2006 | Miles |
| 2006/0274398 A1 | 12/2006 | Chou |
| 2007/0020948 A1 | 1/2007 | Piehl et al. |
| 2007/0040777 A1 | 2/2007 | Cummings |
| 2007/0077525 A1 | 4/2007 | Davis et al. |
| 2007/0086078 A1 | 4/2007 | Hagood et al. |
| 2007/0121118 A1 | 5/2007 | Gally et al. |
| 2007/0177247 A1 | 8/2007 | Miles |
| 2007/0194630 A1 | 8/2007 | Mignard et al. |
| 2007/0279729 A1 | 12/2007 | Kothari et al. |
| 2007/0285761 A1 | 12/2007 | Zhong et al. |
| 2008/0003710 A1 | 1/2008 | Kogut et al. |
| 2008/0013144 A1 | 1/2008 | Chui et al. |
| 2008/0013145 A1 | 1/2008 | Chui et al. |
| 2008/0013154 A1 | 1/2008 | Chui |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0186581 A1 | 8/2008 | Bita et al. |
| 2008/0247028 A1 | 10/2008 | Chui et al. |
| 2009/0009845 A1 | 1/2009 | Endisch et al. |
| 2009/0068781 A1 | 3/2009 | Tung et al. |
| 2009/0080060 A1 | 3/2009 | Sampsell et al. |
| 2009/0135465 A1 | 5/2009 | Chui |
| 2009/0201566 A1 | 8/2009 | Kothari |
| 2009/0213450 A1 | 8/2009 | Sampsell |
| 2009/0213451 A1 | 8/2009 | Tung et al. |
| 2009/0256218 A1 | 10/2009 | Mignard et al. |

FOREIGN PATENT DOCUMENTS

| | | |
|---|---|---|
| EP | 1 122 577 | 8/2001 |
| EP | 1 227 346 | 7/2002 |
| EP | 1 275 997 | 1/2003 |
| EP | 1 473 581 | 11/2004 |
| JP | 5-49238 | 2/1993 |
| JP | 5-281479 | 10/1993 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| JP | 2004-212638 | 7/2004 |
| JP | 2004-212680 | 7/2004 |
| JP | 2005 279831 | 10/2005 |
| WO | WO 99/52006 | 10/1999 |
| WO | WO 02/086582 | 10/2002 |
| WO | WO 2007/072998 | 6/2007 |

OTHER PUBLICATIONS

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Miles, Interferometric modulation: MOEMS as an enabling technology for high performance reflective displays, Proceedings of SPIE, vol. 4985, pp. 131-139, 2003.

Feenstra et al., Electrowetting displays, Liquivista BV, 16 pp., Jan. 2006.

Lezec, Submicrometer dimple array based interference color field displays and sensors, Nano Lett. 7(2):329-333, Dec. 23, 2006.

Invitation to Pay Additional Fees for PCT/US08/057273, filed Mar. 17, 2008.

Conner, "Hybrid Color Display Using Optical Interference Filter Array," SID Digest, pp. 577-580 (1993).

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Miles, Mark, W., "A New Reflective FPD Technology Using Interferometric Modulation", The Proceedings of the Society for Information Display (May 11-16, 1997).

Taii et al., "A transparent sheet display by plastic MEMS," Journal of the SID 14(8):735-741, 2006.

ISR and WO for PCT/US08/057273, filed Mar. 17, 2008.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

IPRP for PCT/US08/057273, dated Oct. 8, 2009.

* cited by examiner

|  | Column Output Signals | |
|---|---|---|
| Row Output Signals | $+V_{bias}$ | $-V_{bias}$ |
| 0 | Stable | Stable |
| $+\Delta V$ | Relax | Actuate |
| $-\Delta V$ | Actuate | Relax |

MICROELECTROMECHANICAL DEVICE AND METHOD UTILIZING CONDUCTING LAYERS SEPARATED BY STOPS

BACKGROUND

1. Field

The field of the invention relates to microelectromechanical systems (MEMS).

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

One embodiment of a microelectromechanical system (MEMS) device comprises a reflective element that comprises at least one stop member. The device also comprises an electrode and an aperture that extends at least partially through the electrode. The aperture has a boundary. The device has an electrically nonconductive surface within the aperture or on a portion of the boundary of the aperture. A support structure separates the reflective element from the electrode. The reflective element can be moved between a first position and a second position. The stop member is spaced from the electrically nonconductive surface when the reflective element is in the first position. A portion of the stop member is in contact with the electrically nonconductive surface when the reflective element is in the second position. The reflective element and the electrode are electrically isolated from each other when the reflective element is in the second position.

Another embodiment of a microelectromechanical system (MEMS) device comprises means for reflecting light and means for conducting electricity. The reflecting means comprises means for stopping movement of the reflecting means. The device also comprises means for receiving the stopping means. The receiving means has a boundary and has an electrically nonconductive portion within the receiving means or on the boundary. The device further comprises means for separating the reflecting means and the conducting means. The reflecting means can be moved between a first position and a second position. The stopping means is spaced from the electrically nonconductive portion when the reflecting means is in the first position, and a portion of the stopping means is in contact with the electrically nonconductive portion when the reflecting means is in the second position. The reflecting means and the conducting means are electrically isolated from each other when the reflecting means is in the second position.

An embodiment of a method of manufacturing a microelectromechanical system (MEMS) device is disclosed. The method comprises providing a substrate and forming an electrode on the substrate. A portion of the electrode may be removed to form an aperture. The method also comprises forming a first sacrificial layer over the electrode and the aperture and removing a portion of the first sacrificial layer over the aperture. A second sacrificial layer may be formed over the first sacrificial layer. The method also includes forming a reflective element over the second sacrificial layer. The reflective element has at least one stop member that extends toward the aperture. The first and the second sacrificial layers may be removed. A MEMS device may be manufactured with this method.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In some embodiments of MEMS devices, an electrically nonconductive layer (e.g., a dielectric layer) is used to electrically isolate and prevent physical contact between a movable reflective element and an electrode when the device is in an actuated or driven state. However, during operation of the device, the nonconductive layer may accumulate trapped charges, which can reduce the performance of the device due to effects such as increased adhesion forces, stiction, and offset shift. Accordingly, it may be advantageous to provide a MEMS device that does not include a nonconductive layer. In order to prevent physical and electrical contact between the reflective element and the electrode, certain embodiments of the MEMS device provide a stop member on the reflective element that extends toward an aperture in the electrode. In the driven state, the stop member contacts an electrically nonconductive surface within the aperture or on a portion of a boundary of the aperture in order to prevent the reflective element from physically or electrically contacting the electrode. For example, the aperture may extend through the electrode to a glass substrate, and the stop member may contact a portion of the glass substrate in the driven state. Such MEMS devices may provide advantages including reduced effects of trapped charges, smaller adhesion forces, lower capacitances, and faster response times.

Figure 1:
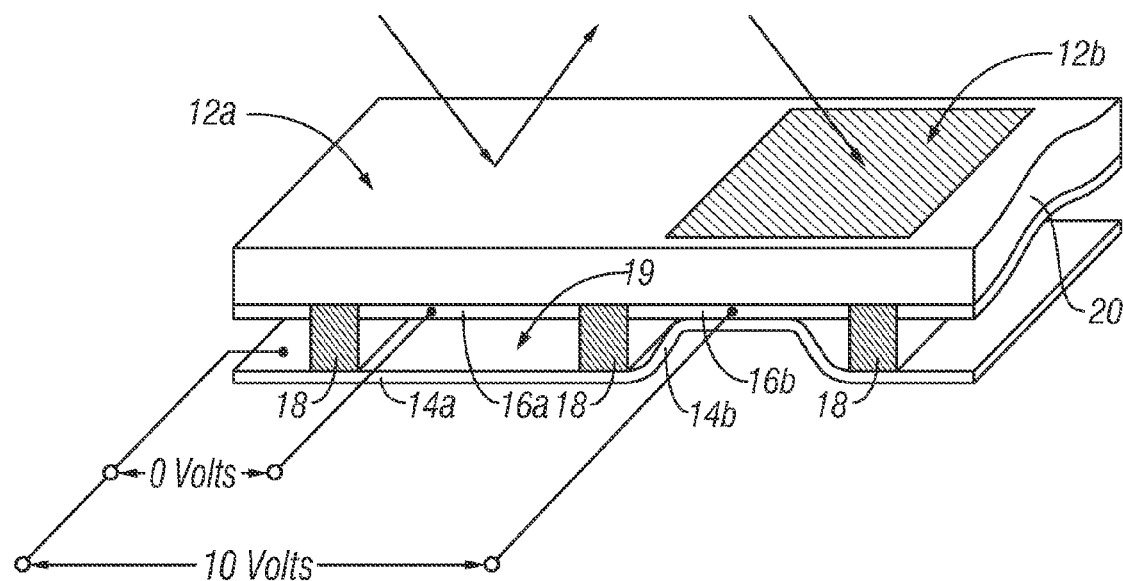
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
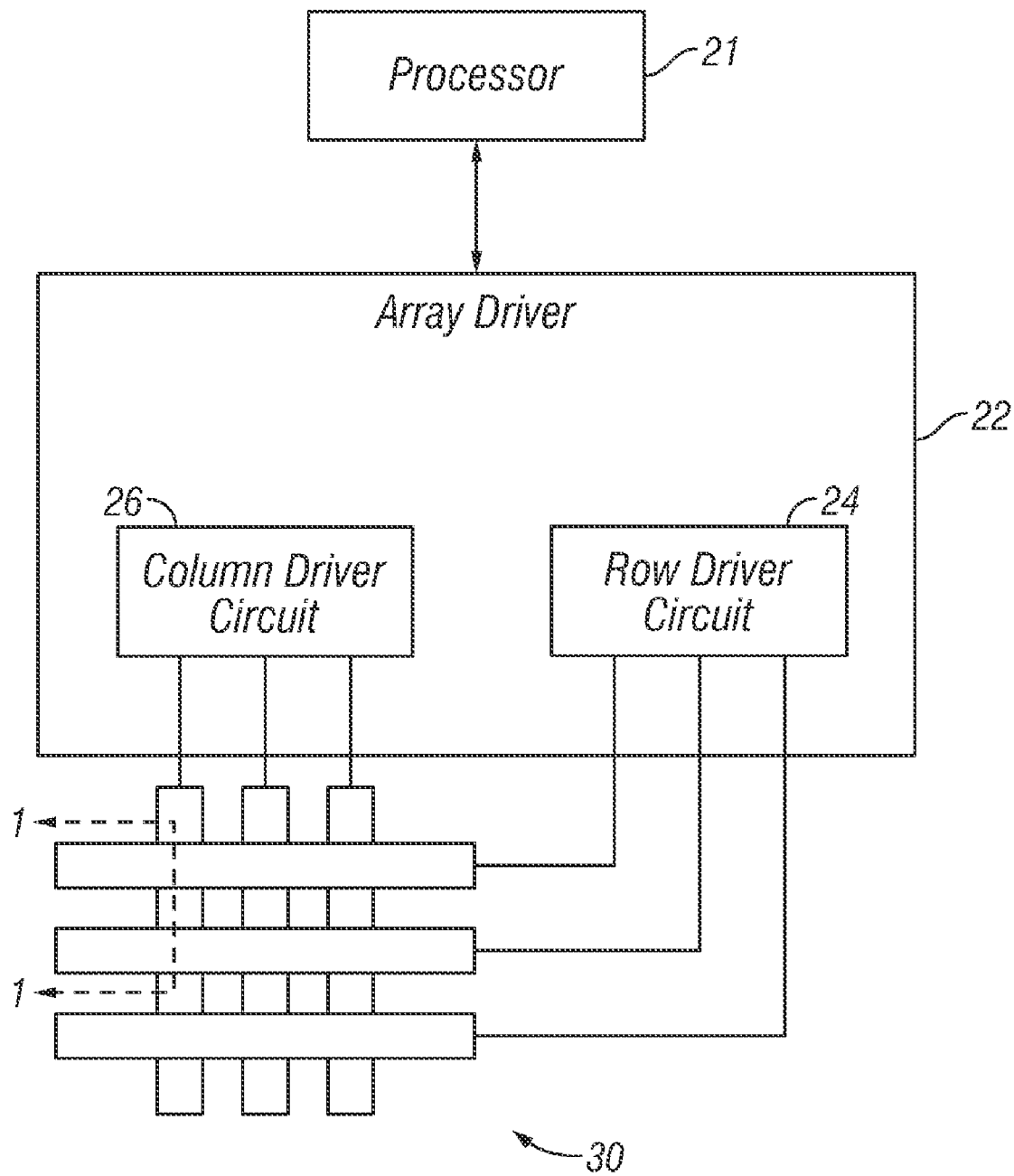
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
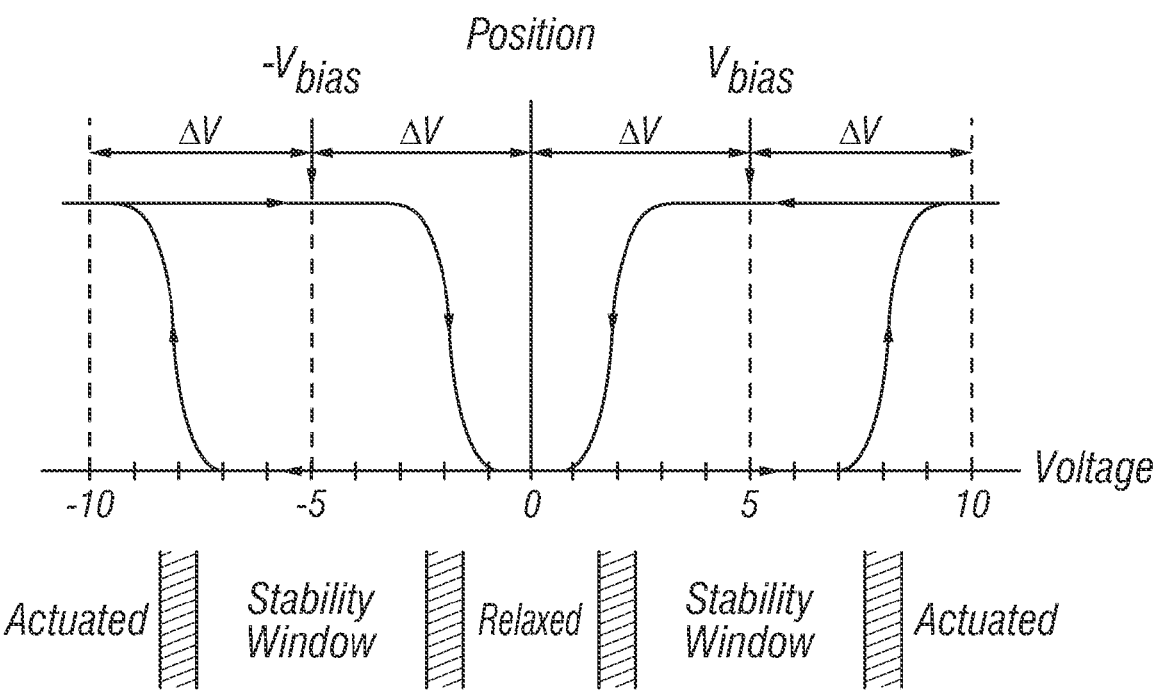
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
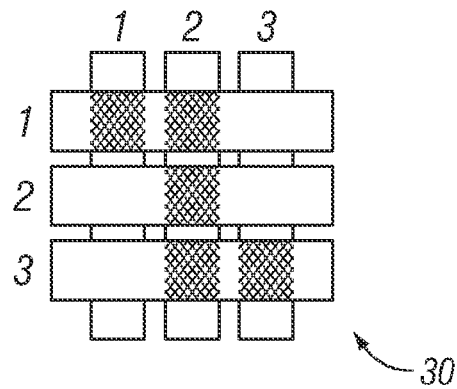
FIG. 5A illustrates one exemplary frame of display data in the 3×3 interferometric modulator display of FIG. 2.
Figure 5B:
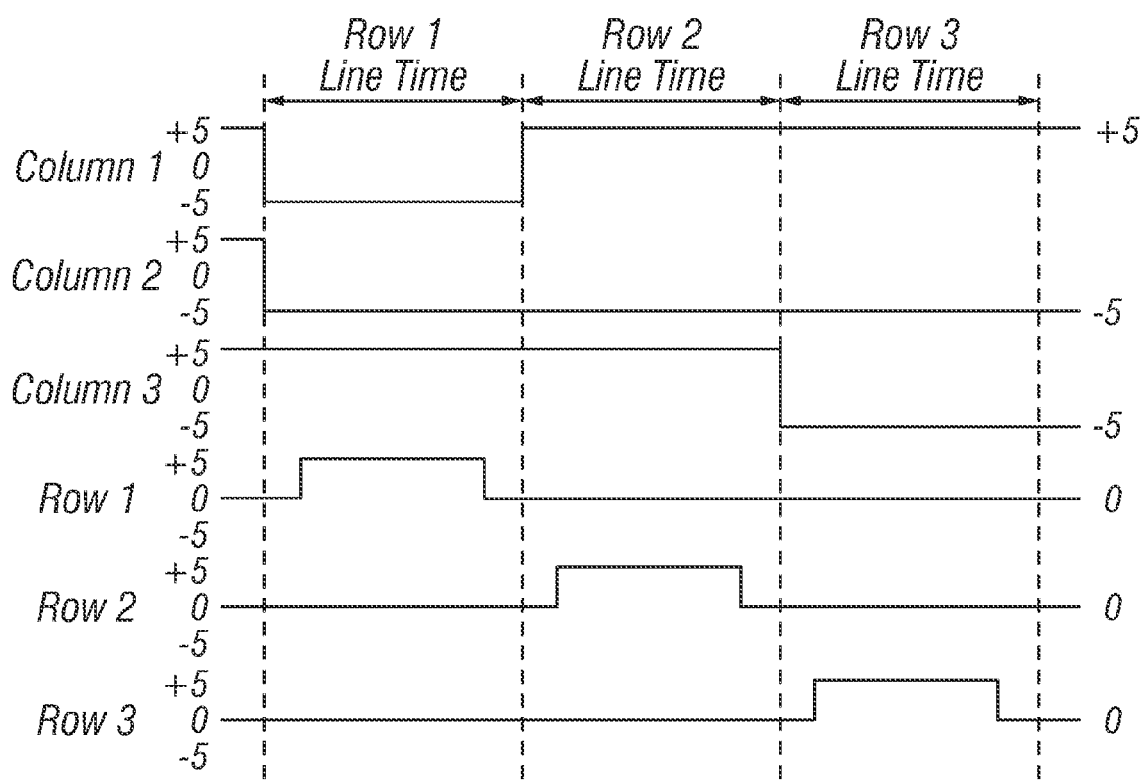
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
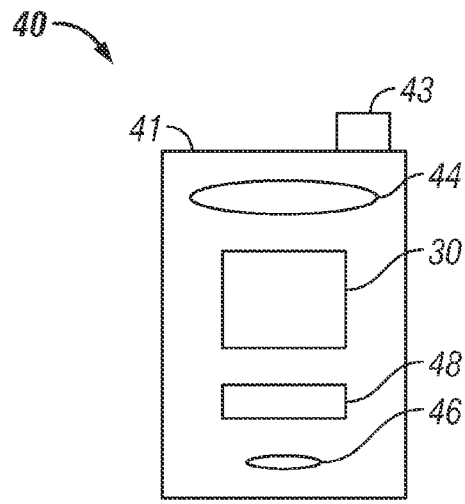
FIGS. 6A and 6B are system block diagrams illustrating an embodiment of a visual display device comprising a plurality of interferometric modulators.
Figure 6B:
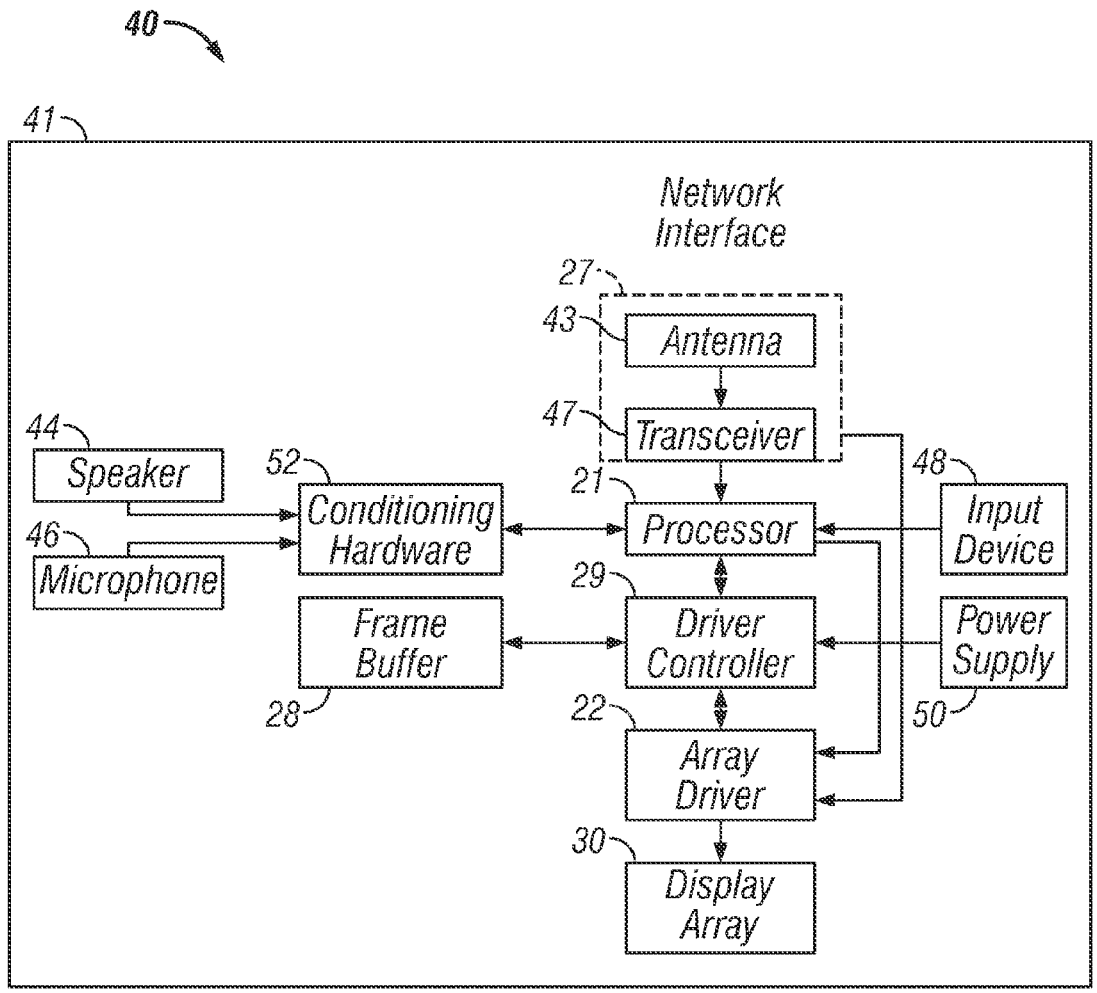

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
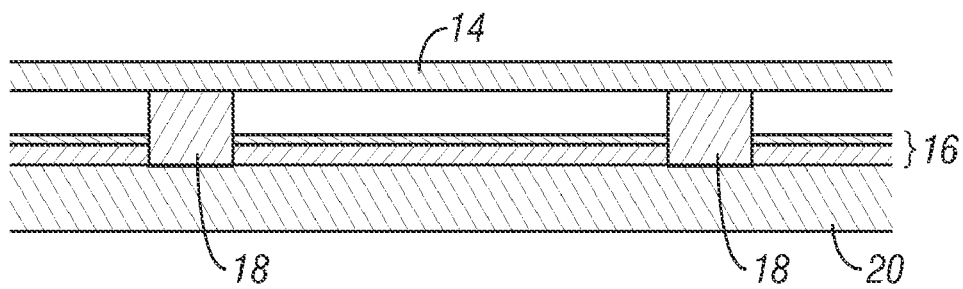
FIG. 7A is a cross section of the device of FIG. 1.
Figure 7B:
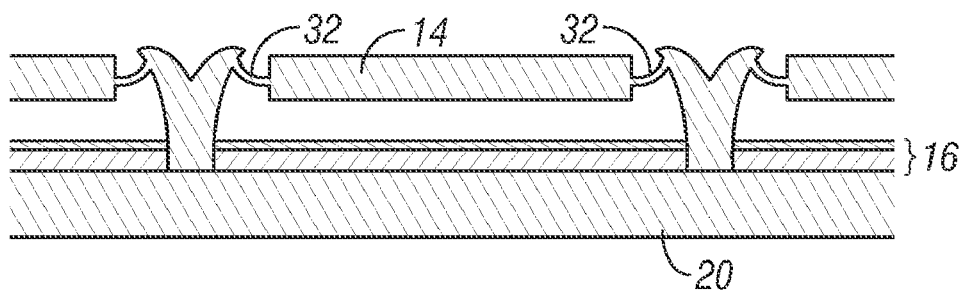
FIG. 7B is a cross section of an alternative embodiment of an interferometric modulator.
Figure 7C:
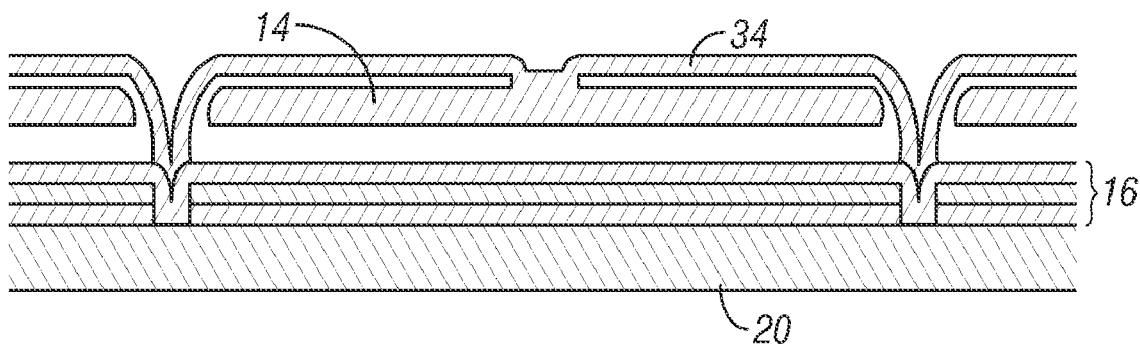
FIG. 7C is a cross section of another alternative embodiment of an interferometric modulator.
Figure 7D:
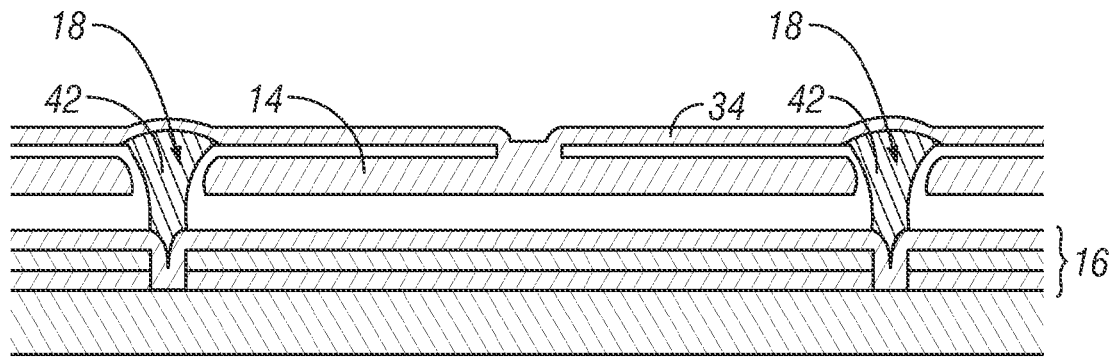
FIG. 7D is a cross section of yet another alternative embodiment of an interferometric modulator.
Figure 7E:
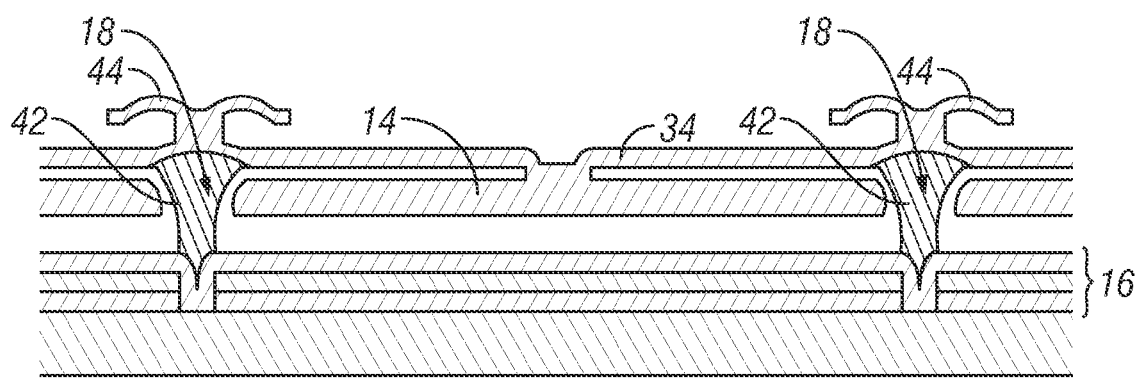
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

In many embodiments of the MEMS devices shown in FIGS. 7A-7E, the optical stack 16 comprises an electrically nonconductive layer comprising a transparent dielectric material formed over an electrically conductive electrode (e.g., an ITO layer). The nonconductive dielectric material prevents electrical shorting between the electrode and the movable reflective layer 14 when the device is in the actuated state. However, MEMS devices formed with such a nonconductive layer may have some disadvantages. During operation of the MEMS device, the nonconductive layer is subject to electric field and direct charge injection and can accumulate trapped charges that may affect the electromechanical behavior, reliability, and hysteresis characteristics of the MEMS device. The trapped charges may induce electrostatic forces on portions of the device and may be a cause of stiction between the moveable reflective layer 14 and the optical stack 16. Additionally, the trapped charges may lead to an offset shift between the positive and negative actuation voltages of the hysteresis window. To avoid the offset shift, some MEMS devices are driven in a charge balanced manner in which the polarity across the device is alternated to reduce trapped charges. However, charge balancing leads to higher power consumption because currents must be driven to remove charges from the nonconductive layer. Further, the presence of the nonconductive layer increases the capacitance of the device (in both the actuated and unactuated states), which results in a larger electrical time constant and limits the possible size of a MEMS device display. Also, to avoid charge drift through leaky dielectrics and dielectric breakdown, expensive and high-quality dielectric materials are typically used for the nonconductive layer during fabrication of the device.

A MEMS device that does not utilize such a nonconductive layer may provide some of the following advantages. The device will accumulate substantially fewer trapped charges, and offset shift and charge-induced stiction will be greatly reduced or eliminated. Without the presence of significant offset shift, the device need not be driven in a charge-balanced manner, thereby decreasing power consumption. The device will have a lower capacitance and a lower electrical time constant, thereby allowing larger displays to be fabricated. Also, fabrication of the device may be less expensive, because deposition of expensive, high-quality dielectric layers is not needed.

However, a MEMS device without a nonconductive layer may suffer from electrical shorting that can occur during the actuated state due to physical contact or electrical arcing between the movable reflective layer 14 and the optical stack 16. Accordingly, to provide a device that achieves some or all of the above advantages, certain embodiments of the present disclosure prevent electrical shorting by using one or more stop members (e.g., bumps or protrusions) on a surface of the movable reflective layer 14 and extending toward the optical stack 16. A portion of the stop member is configured to fit into an aperture formed in the optical stack 16 and which exposes a region of the underlying electrically nonconductive substrate 20. During the actuated state, a portion of the stop member contacts the substrate 20 within the aperture, thereby preventing the movable reflective layer 14 from contacting (and shorting) the electrode layer of the optical stack 16. The height of the stop member can be selected to provide a gap of suitable size between the optical stack 16 and the movable reflective layer 14 in the actuated state. The size of the gaps in the unactuated and actuated states advantageously can be configured to provide bi-chrome MEMS devices that display different colors of light in the actuated and unactuated states. Additionally, smaller adhesion forces are generated in the actuated state in certain such devices, because the area of the stop member that contacts the substrate 20 is substantially smaller than the contact area between the movable reflective layer 14 and the nonconductive layer in other devices. The smaller adhesion forces in certain embodiments described herein may provide improved performance and reliability. In certain embodiments of the device, surfaces of the stop member and/or the aperture are modified (e.g., by roughening or by providing bumps) to further reduce the adhesion force in the actuated state. The modified surfaces of the stop member and/or the aperture do not substantially affect the optical behavior of the device, because regions of the device having stop members and corresponding apertures do not substantially contribute to optical interference in the device. Additionally, in certain such embodiments, these regions are masked by a "black mask" (described further below) to prevent or reduce ambient or stray light from entering and/or leaving these regions.

An embodiment of a MEMS device that incorporates some of the aspects of the present disclosure is now discussed with reference to FIGS. 8A and 8B. A MEMS device 100 comprises a reflective element 104, which comprises at least one stop member 108. The MEMS device 100 further comprises an electrode 112 and an aperture 116 extending at least partially through the electrode 104 and having a boundary 118. The MEMS device 100 also comprises an electrically nonconductive surface 120 within the aperture 116 or on a portion of the boundary 118. A support structure 124 separates the reflective element 104 from the electrode 112. The reflective element 104 is movable between a first position (schematically illustrated in FIG. 8A) and a second position (schematically illustrated in FIG. 8B). When the reflective element 104 is in the first position, the stop member 108 is spaced from the electrically nonconductive surface 120. When the reflective element 104 is in the second position, a portion 136 of the stop member 108 is in contact with the electrically nonconductive surface 120, and the reflective element 104 and the electrode 112 are electrically isolated from each other.

Figure 8A:
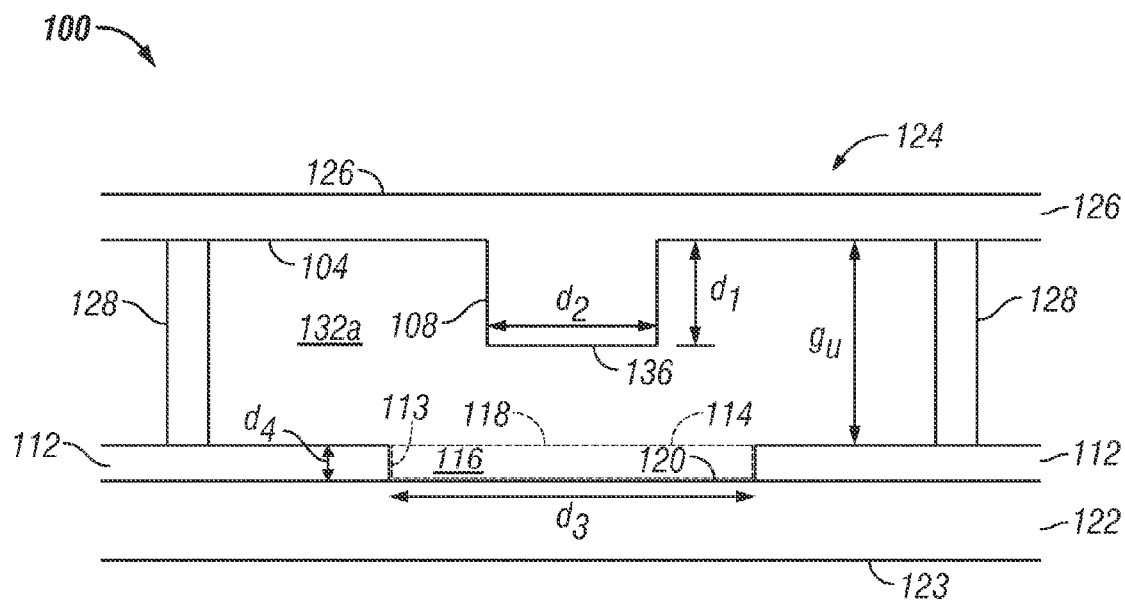
FIG. 8A is a side cross-sectional view of an embodiment of a MEMS device in an unactuated or relaxed state.

FIG. 8A is a side cross-sectional view that schematically illustrates an embodiment of the MEMS device 100 in an unactuated or relaxed state. FIG. 8B is a side cross-sectional view that schematically illustrates the MEMS device 100 in an actuated or driven state. The MEMS device 100 may be formed on a transparent or translucent substrate 122. It is preferred that the substrate 122 comprise an electrically nonconductive material such as a dielectric, which in one embodiment comprises glass. The electrode 112 may be formed on the substrate 122 by, for example, depositing one or more layers of an electrically conductive material such as indium tin oxide (ITO) or chromium. In some embodiments, a partially reflective layer is deposited on the electrode 112. The partially reflective layer may be fabricated from a variety of materials that are partially reflective such as various metals (e.g., chromium), semiconductors, and dielectrics. The partially reflective layer can be formed of one or more layers of materials, and each of the layers can be formed of a single material or a combination of materials. The optical stack 16 of the interferometric modulators shown in FIGS. 7A-7E comprises the electrode 112 and the partially reflective layer. A portion of the electrode 112 may be partially transparent or translucent and partially reflective to light in a range of wavelengths. For example, the wavelength range may include a portion of the visible range of the electromagnetic spectrum. The electrode 112 may be patterned into substantially parallel strips and may form row electrodes in a display device as described herein.

In some embodiments, the electrode 112 may comprise additional layers or regions of partially reflective, partially absorptive, and/or electrically conductive materials. For example, in certain embodiments, the substrate or the electrode 112 comprise additional layers or regions to provide a "black mask" that absorbs ambient or stray light, thereby improving the optical performance of the device 100. In certain such embodiments, the black mask may comprise a first electrically conductive layer formed on the substrate 122 and a second electrically nonconductive layer formed on the first electrically conductive layer. The black mask may also be fabricated from materials selected to have an optical response which absorbs or attenuates light. For example, the black mask may be fabricated as a stack of thin films. In one such embodiment, the stack of thin films may comprise a non-light-absorbing dielectric layer sandwiched between two light reflecting chrome layers. In other embodiments, the black mask may comprise a single layer of organic or inorganic materials which attenuates or absorbs light. In some embodiments, the black mask is formed on a surface 123 of the substrate 122 to inhibit light from entering the device 100 through the aperture 116. Further details for black masks are found in U.S. Pat. No. 6,741,377, issued May 25, 2004, titled "DEVICE HAVING A LIGHT-ABSORBING MASK AND A METHOD FOR FABRICATING SAME," the disclosure of which is hereby incorporated by reference herein in its entirety.

In certain preferred embodiments, a dielectric layer is not formed over the electrode 112. In other embodiments, a passivation layer is formed on the electrode 112 (or on the partially reflective layer, if present), which may protect the electrode 112 (or the partially reflective layer, if present) from corrosion. In some of these embodiments, the passivation layer may be formed from insulating film or conductive film. Insulating films are advantageous, because they may be relatively thin (e.g., in a range from about 50 Å to about 500 Å), since there is little or no electric field where the stop member 108 contacts the nonconductive surface 120 so there is little or no risk of electric breakdown. In contrast to the nonconductive (e.g., dielectric) layers in some devices, there is relatively little or no direct charge injection across or accumulation in such an insulating passivation layer, because the reflective element 104 and the insulating passivation layer are not in physical contact with one another in the actuated state.

The MEMS device 100 comprises the aperture 116, which extends at least partially through the electrode 112. The aperture 116 may be formed as an opening, a recess, and/or a cavity in the electrode 112 in various embodiments. The aperture 116 has a boundary 118, which is schematically illustrated as a dashed line in FIG. 8A. In the embodiment shown in FIGS. 8A and 8B, the aperture 116 extends completely through the electrode 112 and exposes a surface portion of the substrate 122. The boundary 118 of the aperture 116 comprises the exposed surface portion of the substrate 122, edges 113 of the electrode 112, and an imaginary upper surface 114 that is generally coplanar with an upper surface of the electrode 112 near the aperture 116. In some embodiments, the electrically nonconductive surface 120 comprises a portion of the boundary 118. For example, in the embodiment shown in FIG. 8A, the electrically nonconductive surface 120 comprises the exposed surface portion of the substrate 122. In other embodiments, the electrically nonconductive surface 120 is within the aperture 116. For example, in certain other embodiments, the aperture 116 extends only partly through the electrode 112, and a nonconductive layer within the aperture 116 provides the nonconductive surface 120.

The aperture 116 is configured to accept at least a portion 136 of the stop member 108 when the device 100 is in the actuated state, as described further below. In some embodiments, a "black mask" substantially as described above may be used to mask regions of the device 100 near or within the aperture 116 to prevent or reduce ambient or stray light from entering or leaving through the aperture 116. For example, a black mask may be formed on the substrate 122 within the aperture 116, and the electrically nonconductive surface 120 may comprise an electrically nonconductive portion of the black mask.

In certain embodiments of the MEMS device 100, a support structure 124 is disposed over the electrode 112. The support structure 124 may comprise a mechanical layer 126 and one or more support posts 128. In certain such embodiments, at least a portion of the mechanical layer 126 is electrically conductive and can be patterned into substantially parallel strips that form column electrodes in a display device as described herein. The mechanical layer 126 may be fabricated from a deformable and highly conductive and reflective material such as a metal, which in some embodiments may be aluminum or nickel. In some embodiments, the support posts 128 are electrically nonconductive and electrically insulate the mechanical layer 126 from other portions of the device 100 (e.g., the electrode 112). The nonconductive portions of the support posts 128 may comprise a dielectric material such as, for example, aluminum oxide.

Figure 8B:
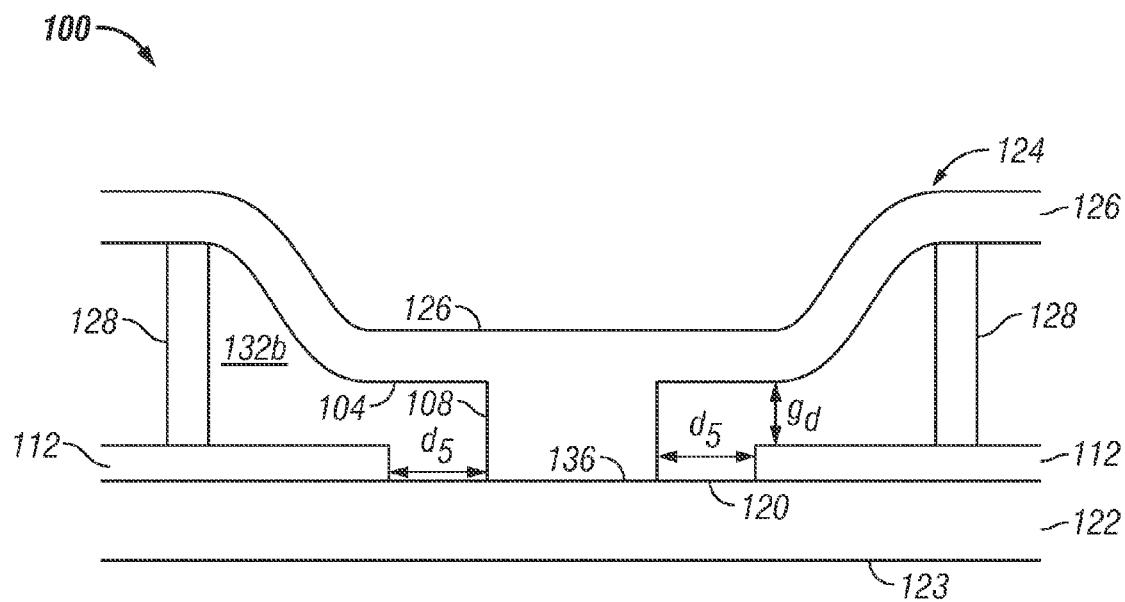
FIG. 8B is a side cross-sectional view of the MEMS device of FIG. 8A in an actuated or driven state.

As schematically illustrated in FIGS. 8A and 8B, the reflective element 104 may comprise a portion of the mechanical layer 126 that is substantially parallel to the electrode 112, and the support structure 124 may be configured so that the reflective element 104 comprises a surface that faces toward the electrode 112. The reflective element 104 is electrically conductive in some embodiments.

As discussed herein with reference to FIG. 1, the mechanical layer 126 may be moved from the relaxed state (the first position) to the driven state (the second position) by applying a voltage difference between the electrode 112 and the mechanical layer 126. If the voltage difference exceeds a threshold value, an electrostatic force causes the mechanical layer 126 to deform from its position in the relaxed state (FIG. 8A) and to move toward the electrode 112. In order to prevent electrical shorting between the reflective element 104 and the electrode 112, the reflective element 104 comprises one or more stop members 108. For example, as shown in FIGS. 8A and 8B, the stop member 108 can comprise a portion of the surface of the reflective element 104 that extends toward the aperture 116. This portion may have a surface that is positioned closer to the electrically nonconductive surface 120 than is the surface of the reflective element 104. In some embodiments, the stop member 108 is electrically conductive. The stop member 108 may be integrally formed with the mechanical layer 126. In some embodiments, the stop member 108 is formed from a separate material that is connected to the mechanical layer 126. The size of the aperture 116 is large enough so that a portion 136 of the stop member 108 can fit within the aperture 116 as the reflective element 104 is driven toward the electrode 112 by the applied driving voltage. In the driven state shown in FIG. 8B, a lower surface of the portion 136 of the stop member 108 contacts the electrically nonconductive surface 120 with the aperture 116, thereby stopping movement of the reflective element 104 toward the electrode 112. In embodiments in which a black mask is disposed in the aperture 116 to absorb or attenuate stray or ambient light, the lower surface of the portion 136 of the stop member 108 may contact an electrically nonconductive region of the black mask in the driven state in order to stop movement of the reflective element 104 toward the electrode 112. The reflective element 104 and the electrode 112 preferably are physically and electrically isolated from each other in the driven state by a gap, which prevents electrical shorting between the reflective element 104 and the electrode 112. Further details of the configurations of the stop member 108 and the aperture 116 are described below.

As further described herein in reference to FIG. 1, the MEMS device 100 may act as an "interferometric modulator." In the unactuated or relaxed state shown in FIG. 8A, a cavity 132a is defined between the reflective element 104 and the electrode 112, which provides a gap having a height $g_u$. Similarly, in the driven or actuated state shown in FIG. 8B, a cavity 132b is defined between the reflective element 104 and the electrode 112, which provides a gap having a height $g_d$. In the unactuated or relaxed state, light incident on a surface 123 of the substrate 122 is transmitted into the cavity 132a. Depending on the height $g_u$ of the cavity 132a, interference causes light of certain wavelengths to be reflected and light of other wavelengths to be absorbed. If the reflected light is in the visible portion of the electromagnetic spectrum, the surface 123 of the substrate 122 will display a color corresponding to the reflected wavelength. In contrast, in the driven state, the height $g_d$ of the cavity 132b is smaller than in the undriven state, and the device 100 absorbs substantially all of the incident light, or at least substantially all of the incident visible light. In the driven state of certain such embodiments, the surface 123 of the substrate 122 will display black. By suitably configuring the size and heights of the cavities 132a, 132b, the device 100 may be used to form pixels in an image display device. For example, in one embodiment, the difference in cavity heights, $g_u - g_d$, is about 1800 Å. In some embodiments, the size and heights of the cavities 132a, 132b are configured to provide a bi-chrome MEMS device, in which the surface 123 of the substrate 122 displays one color when the device is in the relaxed state and a different color when the device is in the driven state.

Figure 9A:
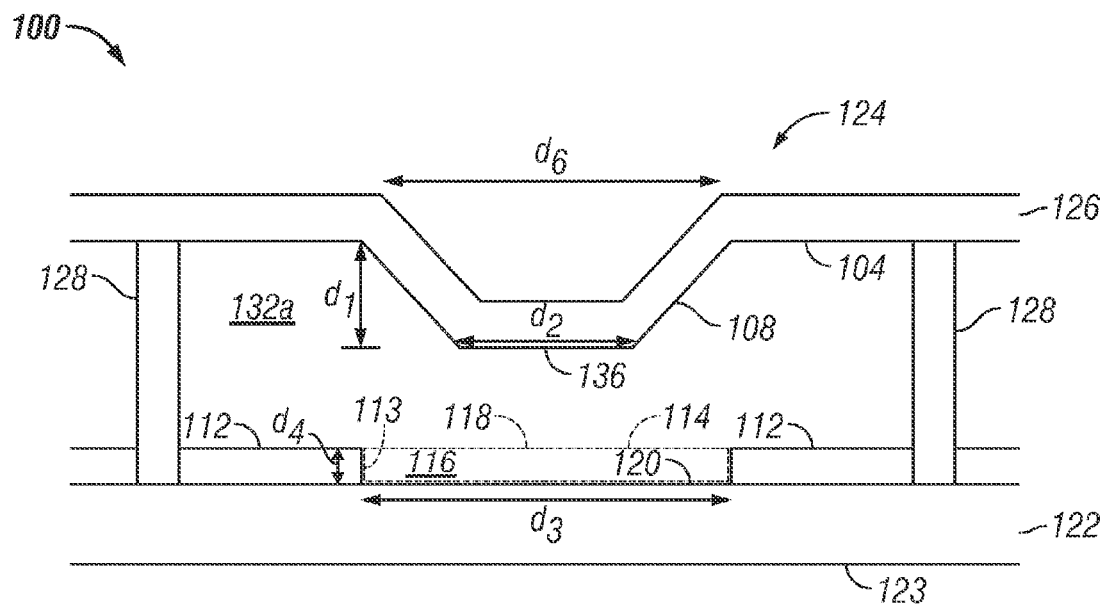
FIGS. 9A and 9B are side cross-sectional views of another embodiment of a MEMS device in a relaxed state (FIG. 9A) and a driven state (FIG. 9B).
Figure 9B:
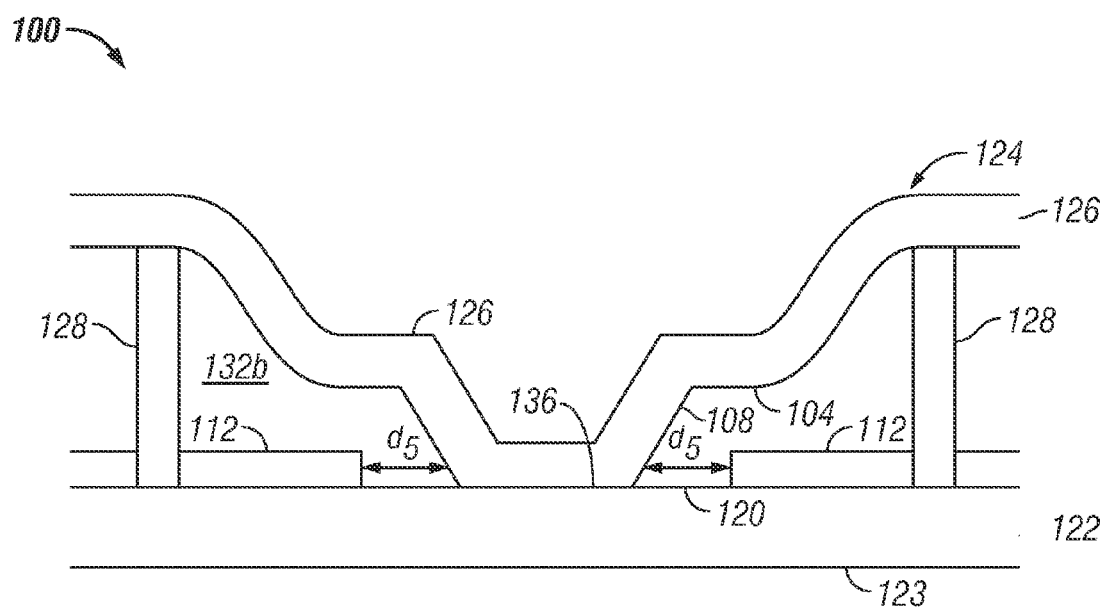

FIGS. 9A and 9B are side cross-sectional views that schematically illustrate another embodiment of the MEMS device 100, which is movable between the first position shown in FIG. 9A (e.g., the relaxed or unactuated state) and the second position shown in FIG. 9B (e.g., the driven or actuated state). The embodiment of the MEMS device 100 shown in FIGS. 9A and 9B is generally similar to the embodiment shown and described with reference to FIGS. 8A and 8B but with some differences described more fully below.

The support structure 124 comprises the mechanical layer 126 and a plurality of posts 128. In the embodiment shown in FIGS. 9A and 9B, the posts 128 extend through the electrode 112 and are in contact with a portion of the substrate 122 below the electrode 112 (unlike in FIGS. 8A, 8B where the posts 128 are in contact with an upper surface of the electrode 112). The reflective element 104 comprises a surface facing toward the electrode 112, and the stop member 108 comprises a portion of the surface of the reflective element 104 facing toward the electrode 112, with the stop member 108 extending toward the aperture 116. A portion of the stop member 108 may be positioned closer to the electrically nonconductive surface 120 than is the surface of the reflective element 104. In some embodiments, the reflective element 104 and/or the stop member 108 are electrically conductive.

In general, the stop member 108 can have any shape and size suitable to prevent contact between the reflective element 104 and the electrode 112. For example, as shown in FIGS. 8A and 8B, the mechanical layer 126 may be formed as a substantially plane-parallel layer, and the stop member 108 may be formed as a protrusion or bump on a surface of the mechanical layer 126 extending toward the electrode 112. Alternatively, as shown in FIGS. 9A and 9B, the stop member 108 may comprise portions of the mechanical layer 126 that are configured to extend toward the electrode 112. The shape and size of the stop member 108 may depend on the process flows used during fabrication of the MEMS device 100 (described further below). Many possible shapes and sizes of the stop member(s) 108 are possible, and the shapes and sizes schematically shown in FIGS. 8A-9B are intended to be illustrative and not intended to be limitations on the stop members 108.

The aperture 116 is configured so that at least the portion 136 of the stop member 108 fits within the aperture 116 when the device 100 is in the actuated state. In the actuated state shown in FIG. 9B, a lower surface of the portion 136 contacts the electrically nonconductive surface 120 within or on a portion of the boundary 118 of the aperture 116, thereby stopping further movement of the reflective element 104 toward the electrode 112 and keeping the reflective element 104 and the electrode 112 electrically isolated from each other.

FIGS. 8A-9A schematically indicate various representative dimensions of some of the features of the MEMS device 100. The dimensions indicated in the figures are intended to illustrate possible sizes of these features but are not intended to be limitations on the dimensions, sizes, shapes, or configuration of features in the device 100. It is recognized that representative dimensions of the features may be defined differently than shown in FIGS. 8A-9A.

As shown in FIGS. 8A and 9A, the stop member 108 extends a length $d_1$ below the reflective element 104. The representative width of the portion 136 of the stop member 108 that contacts the nonconductive surface 120 is $d_2$. Although the stop member 108 shown in FIG. 8A has a generally rectangular shape, the stop member 108 can have any suitable shape including, for example, a generally trapezoidal or pyramidal shape (as shown in FIG. 9A) having a width $d_6$ (near the mechanical layer 126) that is different from and larger than the width $d_2$ (near the portion 136). In other embodiments, the cross-sectional shape of a stop member may be characterized by additional representative widths.

As schematically shown in FIGS. 8A and 9A, the aperture 116 has a cross-sectional width $d_3$. In certain preferred embodiments, the aperture width $d_3$ is larger than the width $d_2$ to permit the portion 116 of the stop member 108 to enter the aperture 116. However, the width of regions of the stop member 108 that do not enter the aperture 116 may be greater than the aperture width $d_3$ (e.g., the width $d_6$). In the MEMS device 100 shown in FIGS. 8B-9B, in the driven state the physical contact area between the portion 136 of the stop member 108 and the nonconductive surface 120 is generally significantly smaller than the physical contact area in a MEMS device having a nonconductive (e.g., dielectric) layer, where substantially all of the reflective element 104 may contact the nonconductive layer. Because the physical contact area is smaller in the device 100, adhesion forces are reduced, and the reflective element 104 beneficially may be more easily released from the driven state.

In the driven state shown in FIG. 8B, a gap between the stop member 108 and the electrode 112 has a width $d_5$, which is approximately equal to $(d_3-d_2)/2$. The gap width $d_5$ preferably should be sufficiently large that the reflective element 104 and the electrode 112 are electrically isolated from each other. For example, the gap width $d_5$ may be large enough to prevent physical contact or electrical arcing between the reflective element 104 and the electrode 112 taking into account the surface roughness of these features (typically, several tens of Ångstroms). Additionally, the aperture width $d_3$ should be large enough that the gap width $d_5$ provides a region between the stop member 108 and the aperture 116 that is sufficiently large that slight mechanical misalignments between the stop member 108 and the aperture 116 (e.g., during fabrication) do not result in physical or electrical contact between these features during operation of the device 100. In some embodiments, the stop member 108 is substantially centered in the aperture 116, and the gap width $d_5$, measured relative to sides of the stop member 108, is approximately the same for one or more of the sides of the stop member 108. In some embodiments, the gap width $d_5$ is in a range from about 0.5 µm to about 2 µm to account for possible misalignments of the stop member 108 in the aperture 116. In certain embodiments, the width $d_2$ of the portion 136 of the stop member 108 is in a range from about 2 µm to about 3 µm, and the aperture width $d_3$ is in a range from about 3 µm to about 5 µm. In some embodiments, the width $d_2$ of the portion 136 of the stop member 108 is in a range from about 0.1 µm to about 4 µm. The width of the aperture 116 may be in a range from about 0.1 µm to about 6 µm. The width $d_6$ of the stop member 108 near the mechanical layer 126 may be in a range from about 4 µm to about 8 µm. In other embodiments, these widths can have different values.

Referring back to FIGS. 8A and 8B, the electrode 112 has a representative thickness $d_4$, which is about 500 Å in some embodiments of the device 100. To avoid physical and electrical contact between the reflective element 104 and the electrode 112 in the driven state, the length $d_1$ of the stop member 108 preferably is larger than the electrode thickness $d_4$. As further described above, in the unactuated state, the cavity 132a provides a gap having the height $g_u$, and in the driven state, the cavity 132b provides a gap having the height $g_d$. The height of the gap $g_d$ in the driven state is approximately $$g_d \approx d_1 - d_4 + \text{S.R.},\qquad(1)$$

where S.R. represents the height of the gap caused by surface roughness of the reflective element 104 and the electrode 112. In some embodiments, the surface roughness is about 200 Å. The height of the driven gap $g_d$ can be selected so that the MEMS device 100 displays a particular color when the device 100 is in the driven state. Equation (1) demonstrates an advantage of the MEMS device 100 of certain embodiments in which the length $d_1$ of the stop member 108 can be fabricated to provide a suitable size for the driven gap height $g_d$ and thereby a suitable display color in the driven state.

In one example embodiment, the MEMS device 100 is configured to have visible light display characteristics similar to a MEMS device having a dielectric layer on the electrode 112. In certain such embodiments, in the driven state, the distance between the reflective element 104 and the upper surface of the electrode 112, $d_1-d_4$, is about 795 Å. Equation (1) shows the height of the gap $g_d$ in the driven state is about 995 Å if the surface roughness is about 200 Å. In this embodiment, the thickness of the electrode 112 is $d_4 \approx 500$ Å; accordingly, the stop member 108 extends a length $d_1 \approx 1295$ Å below the reflective element 104. The height of the gap $g_u$ in the unactuated state is about 2795 Å so that the MEMS device 100 provides a particular display color in the unactuated state. In other embodiments, the length $d_1$ of the stop member 108 is in a range from about 500 Å to about 2000 Å. These representative dimensions are intended to be illustrative, and in other embodiments, some or all of these dimensions may be different.

Various electromechanical parameters of MEMS devices in accordance with certain embodiments disclosed herein will now be described. The MEMS device 100 can be driven between the relaxed and driven states by applying actuation and release voltages across the device according to the hysteresis property described herein with reference to FIG. 3. The device 100 moves from the relaxed state to the actuated state when the applied voltage is increased above an actuation voltage $V_a$, and the device 100 moves from the actuated state to the relaxed state when the applied voltage is reduced below the release voltage $V_r$. The device 100 remains in its actuated or relaxed state if the applied voltage is within a hysteresis window of width $V_w = V_a - V_r$ centered about a bias voltage $V_b \approx (V_a + V_r)/2$. As discussed with reference to FIG. 4, the voltage $V_{bias}$ used to operate the device 100 may be approximately equal to $V_b$. The actuation and release voltages are approximately given by:

$$V_a = \sqrt{\frac{8Kg_u^3}{27\varepsilon A}}, \quad (2)$$

$$V_r = \sqrt{\frac{2K(g_u - g_d)g_d^2}{\varepsilon A}}. \quad (3)$$

In these equations, $\varepsilon = 8.854 \times 10^{-12}$ C/Nm² is the permittivity of free space, K is a stiffness of the MEMS device, A is the cross-sectional area of the region of the mechanical layer 126 overlapping the electrode 112 (as viewed in a plane that is substantially perpendicular to the plane of FIGS. 8A-9B), and $g_u$ and $g_d$ are the heights of the unactuated and driven gaps. The capacitances of the device in the unactuated state, $C_u$, and the driven state, $C_d$, are given by $$C_u = \frac{\varepsilon A}{g_u}, \quad (4)$$

$$C_d = \frac{\varepsilon A}{g_d}. \quad (5)$$

The electric field between the electrode 112 and the reflective element 104 in the driven state is approximately $E_d \approx 2V_b/g_d$.

Table 1 shows representative values of the electromechanical parameters calculated from the above equations for an embodiment of the MEMS device 100 having a stiffness K≈100 N/m, a cross-sectional area A≈1.2×10⁻⁹ m², and cavity heights $g_u$=1295 Å and $g_d$=995 Å. For comparison, Table 1 also lists representative values of the electromechanical parameters for a MEMS device having a dielectric layer on the electrode.

TABLE 1

Electromechanical Parameters of a MEMS Device

| Parameter | Embodiment of MEMS Device 100 | MEMS Device with Dielectric Layer on Electrode |
|---|---|---|
| Actuation Voltage $V_a$ | 7.8 V | 5.15 V |
| Release Voltage $V_r$ | 5.79 V | 1.86 V |
| Window Width $V_w$ | 2.01 V | 3.29 V |
| Bias Voltage $V_b$ | 6.79 V | 3.51 V |
| Unactuated Capacitance $C_u$ | 0.0379 pF | 0.05 pF |
| Driven Capacitance $C_d$ | 0.107 pF | 0.331 pF |
| Driven State Electric Field $E_d$ | 1.36 MV/cm | 1.32 MV/cm |

One advantage of the MEMS device 100 in certain embodiments described herein is that its capacitance, at both the unactuated and driven states, may be reduced compared to a MEMS device having a nonconductive layer between the mechanical layer and the electrode. For example, the capacitances of the embodiment of the MEMS device 100 shown in Table 1 are smaller than typical capacitances in the comparison device having a dielectric layer by about 24% (in the unactuated state) and by a factor of about 3 (in the driven state), which results in smaller electrical time constants. Accordingly, large scale display applications or non-display switching applications that use an array of MEMS devices 100 compatible with certain embodiments described herein may beneficially have significantly faster response times than applications with MEMS devices having nonconductive layers.

Table 1 shows that a representative electric field of the MEMS device 100 in the driven state is about 1.36 MV/cm, which is about an order of magnitude smaller than the electric breakdown field of air. Accordingly, the gap in the cavity 132b (see FIGS. 8B and 9B) will act as an electrical insulator and will allow the electrode 112 and the reflective element 104 to be electrically isolated from each other in the driven state. Since the breakdown voltage depends on factors such as electrode geometry, surface roughness, gas composition, relative humidity, the length $d_1$ of the stop member 108 may be different in other embodiments of the device 100 so that the driven state gap $g_d$ is sufficiently large to prevent electrical breakdown.

Figure 10A:
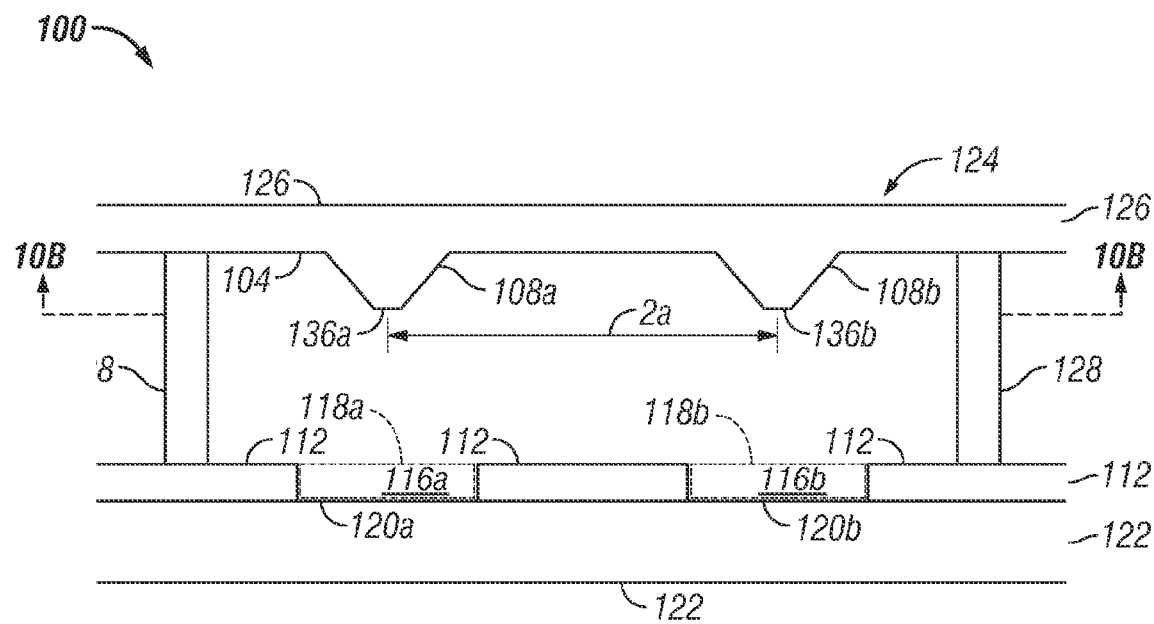
FIG. 10A is a side cross-sectional view of another embodiment of a MEMS device in an unactuated state.

The embodiments of the MEMS device 100 schematically illustrated in FIGS. 8A-9B have one stop member 108 (and associated aperture 116) disposed between the support posts 128. However, different numbers of stop members (and associated apertures) can be used in other embodiments. FIG. 10A is a side cross-sectional view that schematically illustrates another embodiment of the MEMS device 100. This embodiment is generally similar to the embodiments depicted in FIGS. 8A-9B but with some differences as described more fully below. The reflective element 104 includes two stop members 108a and 108b. The electrode 112 includes two apertures 116a and 116b configured to accept portions 136a and 136b of the stop members 108a and 108b, respectively, when the device 100 is in the driven state. Although FIG. 10A shows two sets of stop members 108a, 108b and associated apertures 116a and 116b, other embodiments of the device 100 may use a greater number of sets. For example, some embodiments use three, four, five, six, seven, eight, nine, or more sets of stop members and apertures. In the driven state, lower surfaces of the portions 136a and 136b are in contact respectively with the electrically nonconductive surfaces 120a and 120b within or on portions of boundaries 118a and 118b of the apertures 116a and 116b, thereby stopping movement and preventing electrical shorting of the reflective element 104 and the electrode 112.

In this embodiment, the stop member 108a is generally similar in shape and size to the stop member 108b, although this is not a requirement. In certain embodiments, each of the stop members 108a, 108b extends substantially the same length below the reflective layer so that when the device 100 is in the driven state, the reflective element 104 is substantially parallel to the electrode 112.

Figure 10B:
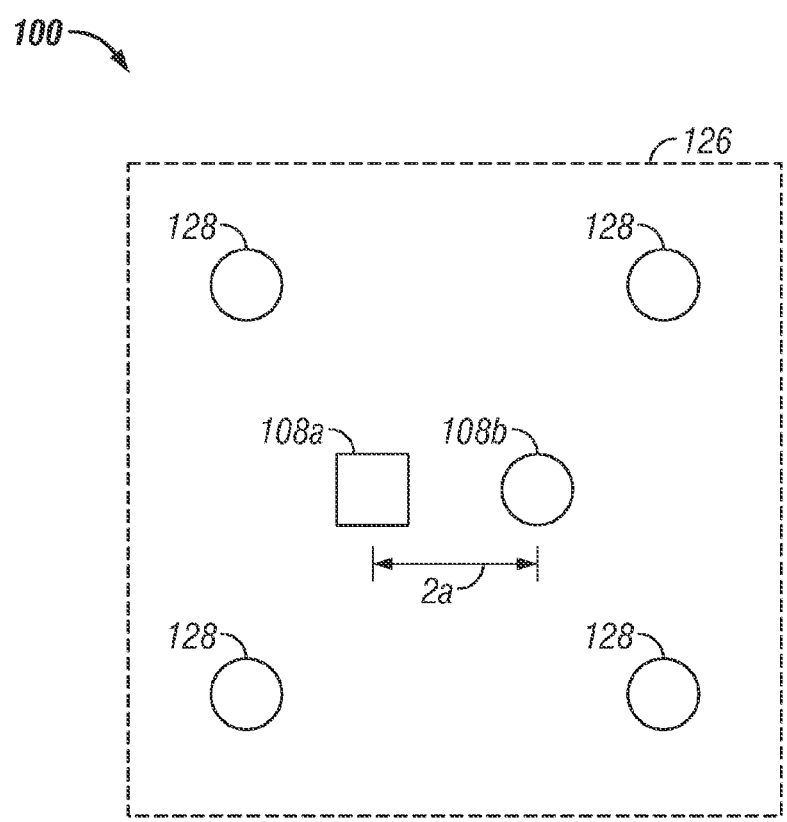
FIG. 10B is a top cross-sectional view of the MEMS device of FIG. 10A taken along the line 10B-10B, schematically illustrating the shapes and layout of stop members.
Figure 10C:
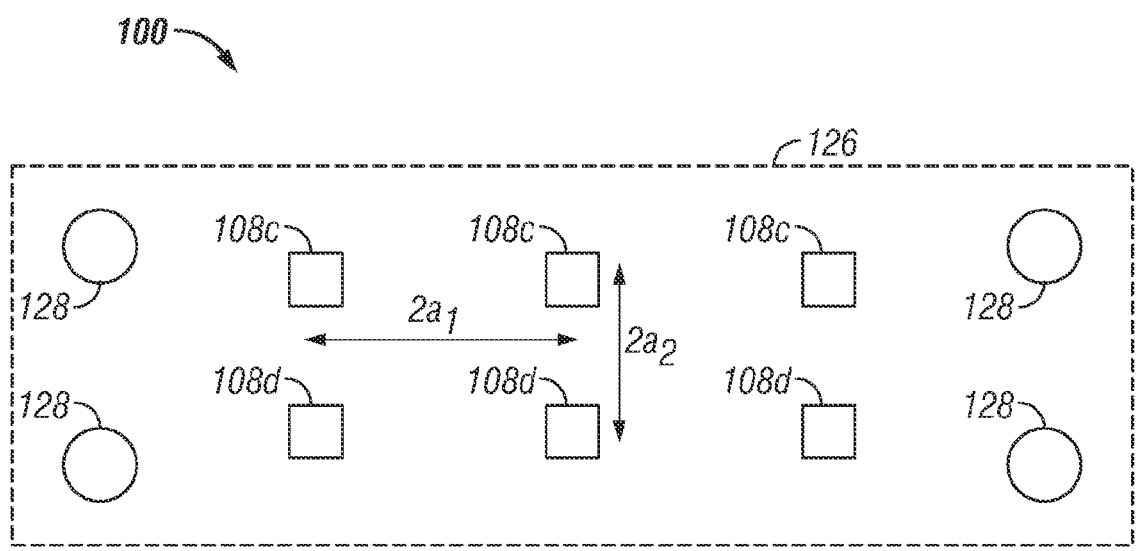
FIG. 10C is a top cross-sectional view of another embodiment of a MEMS device and schematically illustrates another possible configuration of stop members.

FIG. 10B is a top cross-sectional view of the MEMS device 100 taken along the line 10B-10B of FIG. 10A. FIG. 10B schematically shows an example configuration of the support posts 128, and the stop members 108a and 108b. In this embodiment, four posts 128 are used in the support structure 124 that separates the mechanical layer 126 from the electrode 112 and the substrate 122. The four posts 128 are typically disposed near corners of the device 100, which in this embodiment provides a substantially square-shaped display pixel. The stop members 108a and 108b are typically disposed near the center of the device 100. As shown in FIG. 10B, the cross-sectional shapes of the stop members 108a and 108b in a plane generally parallel to the electrode 112 can be different, although this is not a requirement. The stop members 108a, 108b can have any suitable shape and may be, for example, substantially circular, square, rectangular, or polygonal. FIG. 10C is a top cross-sectional view of another embodiment of the MEMS device 100 that provides a substantially rectangular-shaped display pixel. In this embodiment, a total of six stop members 108c, 108d are arranged in two rows, each containing three stop members. The spacing between stop members along a longitudinal direction of the device 100 (e.g., from left to right in FIG. 10C) is $2a_1$, and the spacing along a substantially orthogonal transverse direction (e.g., from top to bottom in FIG. 10C) is $2a_2$, which may be different than the spacing $2a_1$. In the embodiment shown in FIG. 10C, the stop members 108c, 108d have cross-sectional shapes in a plane generally parallel to the electrode 112 that are substantially the same. Many other configurations of stop members and support posts are possible, and the examples shown in FIGS. 10A-10C are intended to be illustrative and not intended to be limiting.

Stop members 108 may be fabricated on the reflective element 104 (or as part of the mechanical layer 126) with a sufficient "density" (e.g., the number of stop members per unit length of the mechanical layer 126) so that a sufficient gap is maintained between the reflective element 104 and the electrode 112 in the driven state to provide electrical isolation (e.g., to avoid electrical shorting or arcing) between the reflective element 104 and the electrode 112. Additionally, the density of stop members 108 may be selected so that regions of the mechanical layer 126 between adjacent stop members 108 of the reflective element 104 do not substantially deflect or deform under the load caused by electrostatic forces acting on the mechanical layer 126. In some embodiments of the device 100, the density of stop members 108 is selected so that the deflection of these regions is sufficiently small, for example, to prevent physical or electrical contact between the regions of the reflective element 104 and the electrode 112 and/or to keep the reflective element 104 substantially parallel to the electrode 112.

In certain embodiments of the device 100, the density of stop members 108 used to adequately support the mechanical layer 126 (or the reflective element 104) can be estimated as follows. An approximate formula for the deflection of a structure suspended by stop members 108 spaced apart by a distance 2a and subject to a uniform pressure p is $$p = \frac{3t\sigma d}{a^2} + \frac{1.8Etd^3}{a^4}. \tag{6}$$

In Equation (6), t is the thickness of the structure, d is the deflection at a center point between adjacent stops, σ is the residual stress and E is the elastic modulus of the structure. The pressure p may be estimated by dividing the electrostatic force on the structure by the structure area (e.g., $4a^2$). In some embodiments, the electrostatic force is estimated assuming a voltage of $2V_b$ is applied across the structure; however, in other embodiments, smaller voltages may be appropriate. Equation (6) can be solved to determine the spacing 2a between adjacent stop members 108. The number of stop members 108 in the MEMS device 100 can be approximately estimated by dividing the distance between the posts 128 by the spacing 2a.

The separation between stop members 108 can be estimated in one embodiment of the device 100 by having a center point deflection d smaller than the height $g_d$ of the gap in the driven state to prevent physical contact and electrical shorting. In this embodiment, the thickness of the structure is t=1000 Å, the residual stress is σ=350 MPa, and the elastic modulus is E=210 GPa. Assuming a voltage of $2V_b$, the pressure on the structure is 82.7 kPa, and Equation (6) determines the spacing between adjacent stops to be about 2a=22.5 μm. In this embodiment, the distance between the posts 128 is about 40 μm, and one stop member 108 can adequately support the reflective element 104 from substantial deflection. In devices where a smaller voltage than $2V_b$ is appropriate, the spacing between adjacent stop members 108 is increased.

In applications where the MEMS device 100 acts as an interferometric modulator, the optical properties of the device 100 are determined in part by constructive and/or destructive interference effects as the light reflects between the reflective layer (e.g., the reflective element 104) and the optical stack 16 (e.g., a partially reflective layer formed on the electrode 112). Light that enters the device 100 through the aperture 116 in the electrode 112 may not experience the same amount of constructive or destructive interference compared to light that passes through the electrode 112. Accordingly, the optical performance of a display pixel corresponding to the MEMS device 100 may be slightly different in the region of the aperture 116. However, this optical performance difference is relatively small in embodiments in which the aperture width $d_3$ is small compared to the spacing between adjacent stop members 108. For example, the loss in optical fill factor due to the aperture 116 is about $(d_3/2a)^2$, and is only 7% in an embodiment with a 6 μm aperture width and 22.5 μm stop member spacing. By reducing the applied voltage difference from $2V_b$ to a value that is slightly larger than the actuation voltage $V_a$, certain embodiments described herein advantageously result in not only greater spacing between adjacent stop members but also a smaller loss in the optical fill factor.

Embodiments of MEMS devices that incorporate some or all of the features of the present disclosure can be configured differently than shown in FIGS. 8A-10C. For example, FIGS.

Figure 11A:
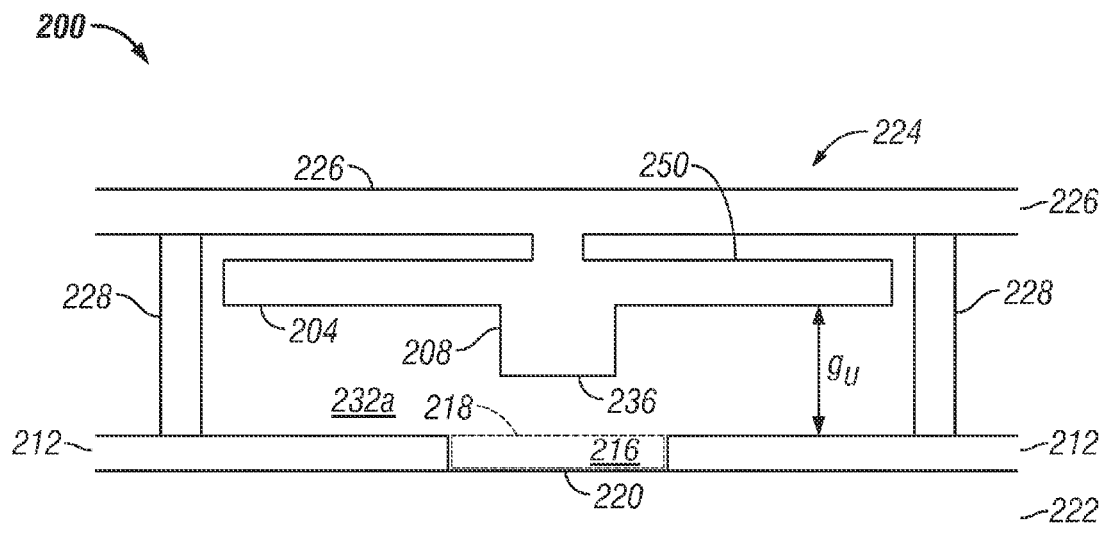
FIG. 11A is a side cross-sectional view of an unactuated or relaxed state of a MEMS device in which a reflective element is attached to a mechanical layer.
Figure 11B:
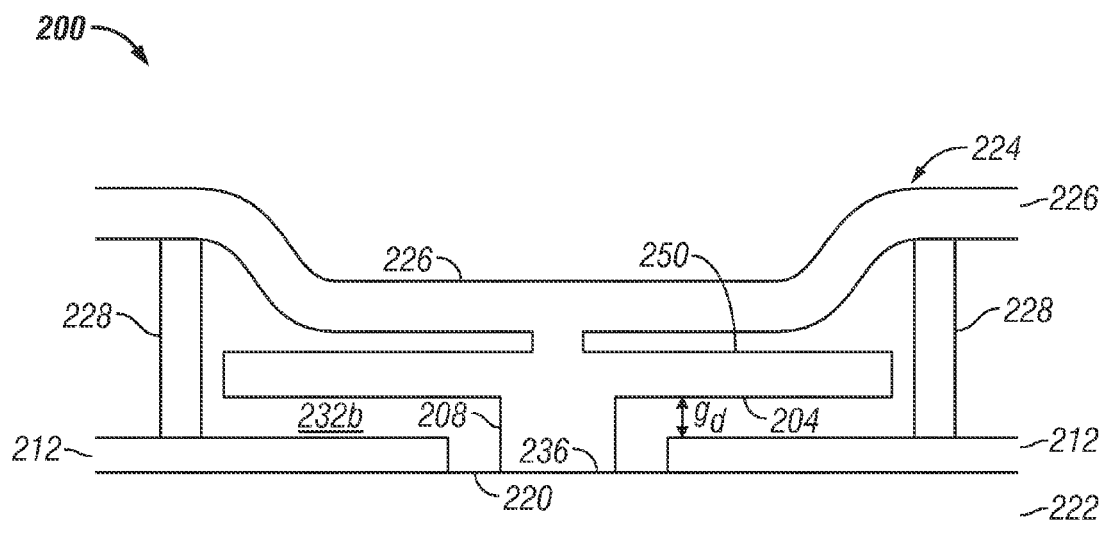
FIG. 11B is a side cross-sectional view of the MEMS device of FIG. 11A in an actuated or driven state.

11A and 11B are side cross-sectional views schematically illustrating another embodiment of a MEMS device 200 in the relaxed state (FIG. 11A) and the driven state (FIG. 11B). The MEMS device 200 comprises a reflective element 204, which comprises at least one stop member 208. The MEMS device 200 further comprises an electrode 212 and at least one aperture 216 having a boundary 218. An electrically nonconductive surface 220 is within the aperture 216 or on the boundary 218. The MEMS device 200 also includes a support structure 224 that separates the reflective element 204 from the electrode 212. The reflective element 204 is movable between a first position (schematically illustrated in FIG. 11A) and a second position (schematically illustrated in FIG. 11B). When the reflective element 204 is in the first position, the stop member 208 is spaced from the electrically nonconductive surface 220. When the reflective element 204 is in the second position, a portion 236 of the stop member 208 is in contact with the electrically nonconductive surface 220, and the reflective element 204 and the electrode 212 are electrically isolated from each other.

In the embodiment shown in FIGS. 11A and 11B, the support structure 224 comprises a mechanical layer 226 and one or more support posts 228. The electrode 212 of certain embodiments comprises an electrically conductive material such as ITO and may be formed on an electrically nonconductive substrate 222. In some embodiments, a partially reflectively layer (e.g., chromium) is deposited on the electrode 212 to form the optical stack 16 (see FIGS. 7A-7E). The substrate 222 may be a dielectric material (e.g., glass). The electrically nonconductive surface 220 may comprise a portion of the substrate 222. In some embodiments, the aperture 216 extends completely through the electrode 212 and exposes a portion of the electrically nonconductive substrate 222. In certain embodiments, a black mask (as described above) may be formed on the substrate 222 within the aperture 216, and the electrically nonconductive surface 220 may comprise an electrically nonconductive portion of the black mask. In other embodiments, the black mask is formed on a surface of the substrate 222 to inhibit light from entering the device 200 through the aperture 216.

As shown in FIGS. 11A and 11B, the reflective element 204 comprises a portion of a mirror 250 that is mechanically coupled to the mechanical layer 226. The mirror 250 generally is disposed between the mechanical layer 226 and the electrode 212 such the reflective element 204 is substantially parallel to the electrode 212. In some embodiments, the reflective element 204 and/or the stop member 208 are electrically conductive. In some embodiments, the mirror 250 comprises an electrically conductive material (e.g., ITO, aluminum, or nickel) and is both mechanically and electrically coupled to the mechanical layer 226.

The MEMS device 200 may be operated in a similar manner to the MEMS device 100 described above with reference to FIGS. 8A-10C. For example, the mechanical layer 226 may be moved from the relaxed state (the first position) to the driven state (the second position) by applying a voltage difference between the electrode 212 and the mechanical layer 226. If the voltage difference exceeds a threshold value, an electrostatic force causes the mechanical layer 226 to deform from its position in the relaxed state (FIG. 11A) and to move toward the electrode 212. In certain embodiments, electrical shorting between the reflective element 204 and the electrode 212 is advantageously prevented by one or more stop members 208 on the reflective element 204 or the mirror 250. For example, as shown in FIGS. 11A and 11B, the stop member 208 can comprise a portion of the reflective element 204 that extends toward the aperture 216 in the electrode 212. A portion 236 of the stop member 208 may be closer to the electrically nonconductive layer 220 than is the reflective element 204. In other embodiments, the mirror 250 includes portions that extend toward the aperture 216 (see, e.g., FIG. 13L). In some embodiments, the stop member 208 is electrically conductive. The stop member 208 can have any suitable size and shape, and in some embodiments two, three, four, five, six, or more stop members 208 are utilized.

The size of the aperture 216 of certain embodiments is configured to be large enough so that the portion 236 of the stop member 208 fits within the aperture 216 as the reflective element 204 is driven toward the electrode 212 by the applied driving voltage. In the driven state shown in FIG. 11B, a lower surface of the portion 236 of the stop member 208 contacts the electrically nonconductive surface 220 within or on a portion of the boundary 218 of the aperture 216, thereby stopping movement of the reflective element 204 toward the electrode 212. The reflective element 204 and the electrode 212 preferably are physically and electrically isolated from each other in the driven state by a gap, which prevents electrical shorting between the reflective element 204 and the electrode 212.

As described above with reference to FIGS. 8A-10C, the representative lengths, widths, and distances in the device 200 can be selected to provide desirable features such as, e.g., a bi-chrome display, electrically insulating gaps in the driven state, etc. The number of stop members 208 used to adequately support the reflective element 204 (and mirror 250) in the driven state may be estimated as described above with reference to Equation (6). For example, in one embodiment of the device 200, the thickness of the structure is t=10,000 Å, the residual stress is σ=50 MPa, and the elastic modulus is E=70 GPa. The spacing between adjacent stop members 208 is found to be 2a=27 µm. In this embodiment, the spacing between support posts is 20 µm in a first direction and 70 µm in a substantially orthogonal second direction. Accordingly, a single stop member 208 can provide adequate support against deflection in the first direction, while two or three stop members 208 are used to provide adequate support in the second direction. A top cross-sectional view of this embodiment is similar to the view schematically shown in FIG. 10C but having only a single row of three stop members disposed between the support posts.

Generally, the MEMS devices disclosed herein can be fabricated utilizing conventional thin layer forming processes including, for example, photolithography, deposition, etching, patterning, and masking techniques. As an illustrative example, a process flow for fabricating an embodiment of the MEMS device that is generally similar to the device 100 shown in FIGS. 9A and 9B will now be described with reference to FIGS. 12A-12J.

Figure 12A:
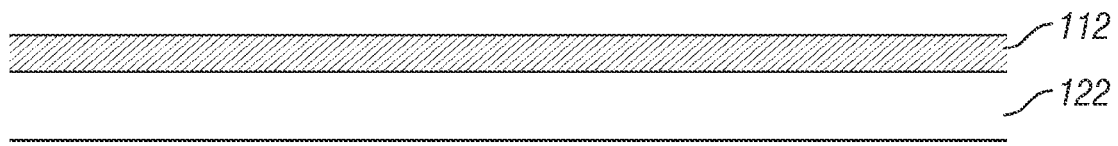
FIGS. 12A-12J are side cross-sectional views schematically illustrating a process flow used to fabricate a MEMS device having a stop member formed on a mechanical layer.

FIG. 12A schematically illustrates the formation of the electrode 112 on the substrate 122 by deposition, and preferably by chemical vapor deposition (CVD). The substrate 122 comprises an electrically nonconductive material, which can be a dielectric such as glass. The electrode 112 comprises an electrically conductive material, which can be a metal such as aluminum, titanium, or chromium, a metal oxide such as indium tin oxide, or a suitable alloy. The thickness of the electrode 112 may be in a range from about 50 Å to about 1000 Å and preferably about 500 Å. In some processes, a partially reflective layer is formed on the electrode 112. The partially reflective layer may be fabricated from a variety of materials that are partially reflective such as various metals (e.g., chromium), semiconductors, and dielectrics. The partially reflective layer can be formed of one or more layers of materials, and each of the layers can be formed of a single material or a combination of materials. The optical stack 16 of the interferometric modulators shown in FIGS. 7A-7B comprises the electrode 112 and the partially reflective layer.

Figure 12B:
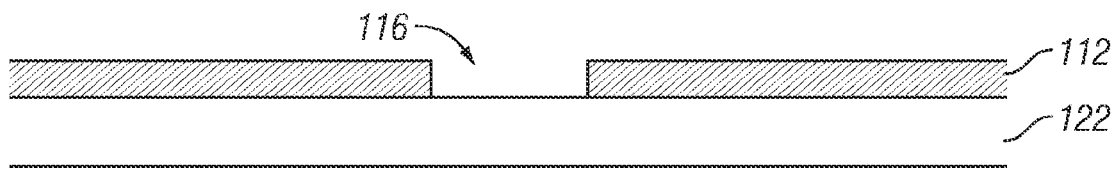
Figure 12C:
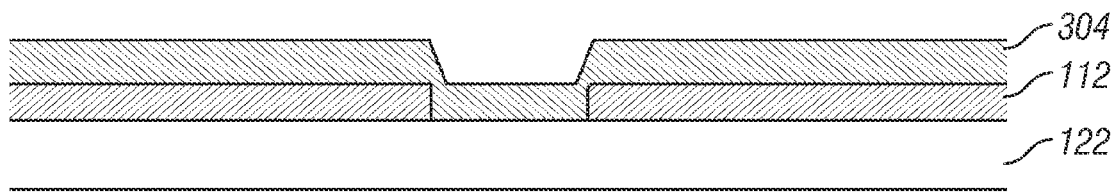
Figure 12D:
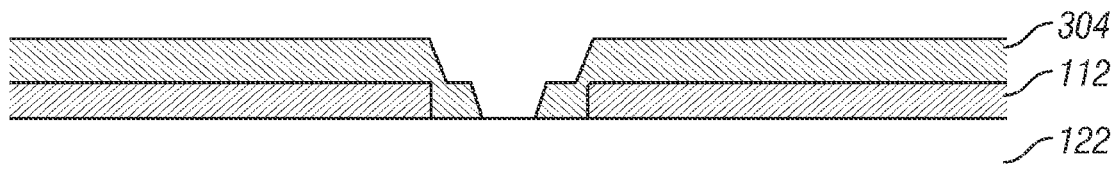

FIG. 12B schematically illustrates the formation of the aperture 116 by removing a portion of the electrode 112 (and the partially reflective layer, if present). In one embodiment, the aperture 116 is patterned as a 6 µm×6 µm region, which is removed by etching the electrode 112 down to the substrate 122. In another embodiment, the aperture 116 is patterned as a 4 µm×4 µm region, and then etched down to the substrate 122. In certain embodiments, the aperture 116 may have a width in a range from about 0.1 µm to about 6 µm. In some embodiments, the aperture 116 extends partially through the electrode 112. FIG. 12C schematically illustrates the formation of a first sacrificial layer 304 over the electrode 112. The first sacrificial layer 304 generally defines the height of the gap between the reflective element 104 and the electrode 112 in the driven state. In terms of the dimensions shown in FIG. 9A, the thickness of the first sacrificial layer 304 is approximately equal to $d_1-d_4$ in some embodiments and is about 795 Å in one embodiment. The first sacrificial layer 304 is patterned and etched in the region of the aperture 116 as shown in FIG. 12D. Sulfur hexafluoride (SF6) may be used as the etchant. In some embodiments, a region of the first sacrificial layer 304 is etched down to the substrate 122, with this region ultimately defining the portion 136 of the stop member 108 that contacts the substrate 122 to stop movement of the reflective element 104 in the driven state. In another embodiment of this process flow, a timed etch is used to etch 795 Å regions deep into the first sacrificial layer 304 above the aperture 116.

Figure 12E:
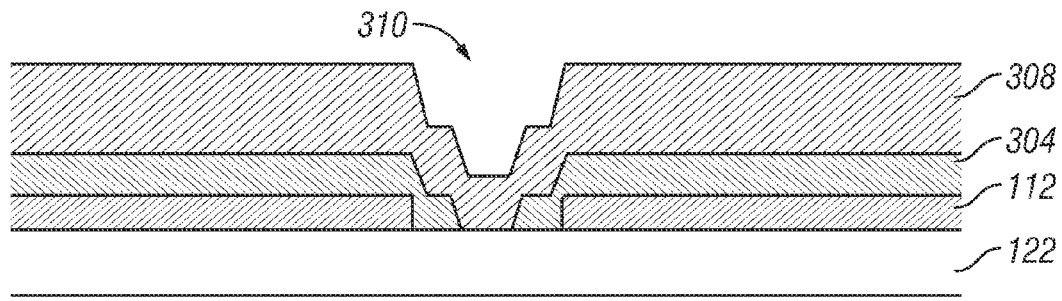

FIG. 12E schematically illustrates the formation of a second sacrificial layer 308 over the first sacrificial layer 304. The height of the first sacrificial layer 304 and the second sacrificial layer 308 generally define the height of the gap $g_u$ between the reflective element 104 and the electrode 112 in the relaxed state. In terms of the dimensions shown in FIG. 9A, the thickness of the second sacrificial layer 308 is about $g_u-(d_1-d_4)$ in some embodiments and is 2000 Å in one embodiment. In certain implementations, the second sacrificial layer 308 is deposited as a conformal thin film layer over the first sacrificial layer 304. The second sacrificial layer 308 includes a region 310 that defines the shape of the stop member 108 (which is formed in a later processing step). The region 310 has a depth of about 1295 Å in one embodiment. The size and shape of the stop member 108 can be configured by suitably patterning and etching the region 310.

Figure 12F:
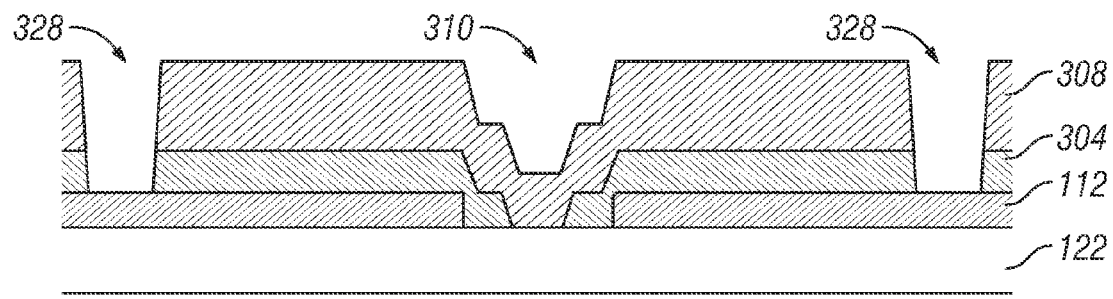
Figure 12G:
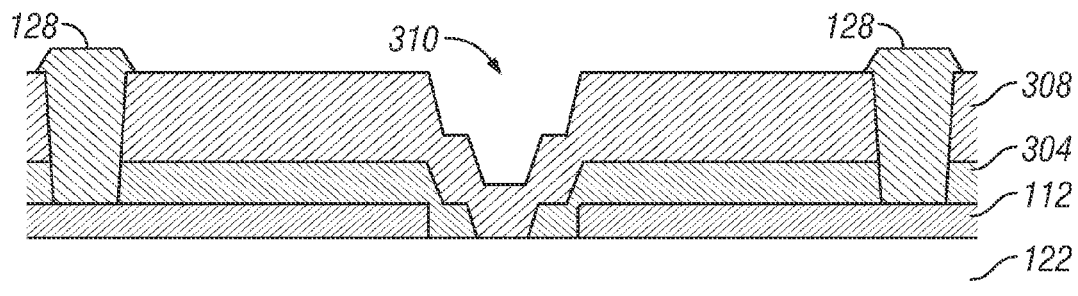

The first and second sacrificial layers 304 and 308 may be patterned and etched to form holes 328 as schematically shown in FIG. 12F, which may be filled with an electrically nonconductive material to form the support posts 128 as schematically shown in FIG. 12G. FIG. 12F shows an embodiment in which the holes 328 extend through the first and second sacrificial layers 304 and 308 down to the electrode 112. In such embodiments, the support posts 128 are coupled to a surface of the electrode 112. However, in other embodiments, the holes 328 can be etched down to the substrate 122 so that the posts 122 are coupled thereto. The support posts 128 may be formed from a dielectric material such as aluminum oxide and/or silicon dioxide. In some embodiments, the support posts 128 are shaped by additional patterning and etching steps.

Figure 12H:
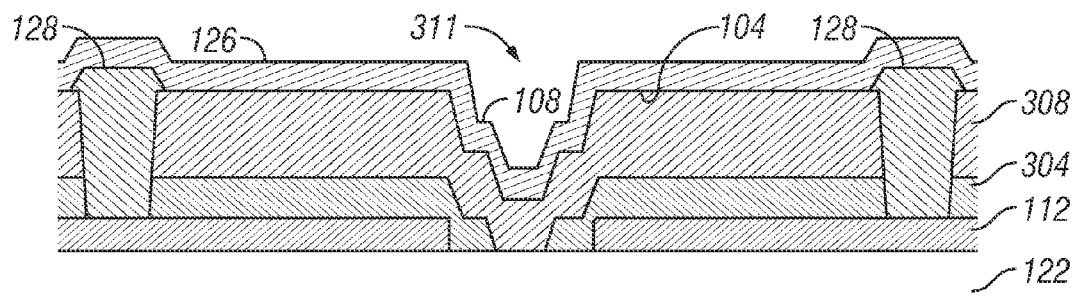

FIG. 12H schematically illustrates the formation of the mechanical layer 126 over the second sacrificial layer 308 (e.g., by deposition). An electrically conductive, mechanically deformable, and highly reflective material such as aluminum may be used for the mechanical layer 126. In some embodiments, the reflective element 104 comprises a portion of the lower surface of the mechanical layer 126 shown in FIG. 12H. In certain embodiments, the mechanical layer 126 is deposited as a conformal thin film over the second sacrificial layer 308. The thickness of the mechanical layer 126 may be in a range from about 300 Å to about 10000 Å and preferably may be about 5000 Å. In this embodiment, the stop member 108 is formed by a portion of the mechanical layer 126 that fills the region 310. In the embodiment shown in FIG. 12H, the stop member 108 has an inner surface that defines a region 311 that does not contain the material of the mechanical layer 126; however, in other embodiments, the region 311 is filled (at least partly) with material (e.g., to form stop members illustrated in FIGS. 8A and 10A).

Figure 12I:
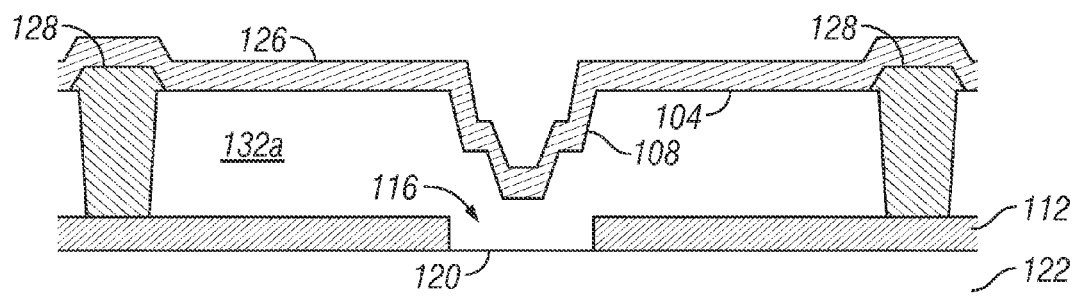
Figure 12J:
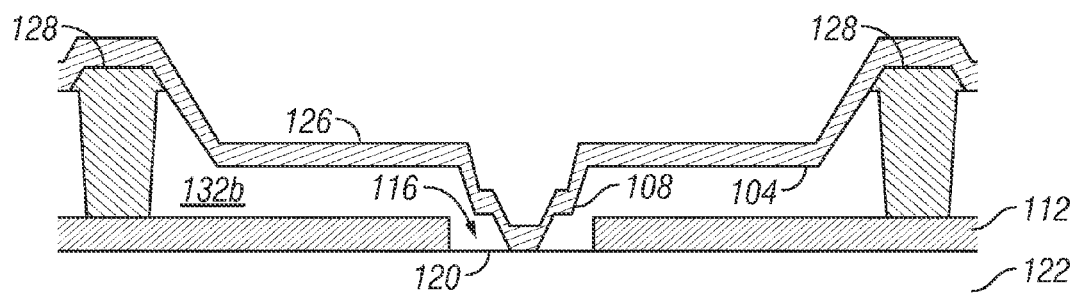

The first and second sacrificial layers 304 and 308 are removed by, for example etching, to produce the MEMS device schematically illustrated in FIG. 12I. As a result, the space filled by the first and second sacrificial layers 304 and 308 becomes the interferometric cavity 132a of the completed MEMS device in the unactuated state. Substances such as $XeF_2$, $F_2$, or HF may be used as the etchant, alone or in combination. The MEMS device produced by the above-described process is schematically illustrated in FIG. 12J in the driven state.

Figure 13A:
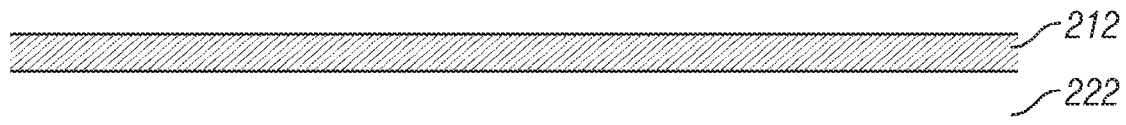
FIGS. 13A-13L are side cross-sectional views schematically illustrating a process flow used to fabricate a MEMS device having a stop member disposed on a mirror attached to a mechanical layer.
Figure 13B:
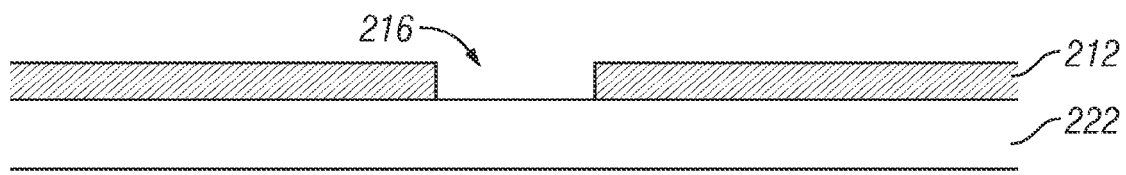
Figure 13C:
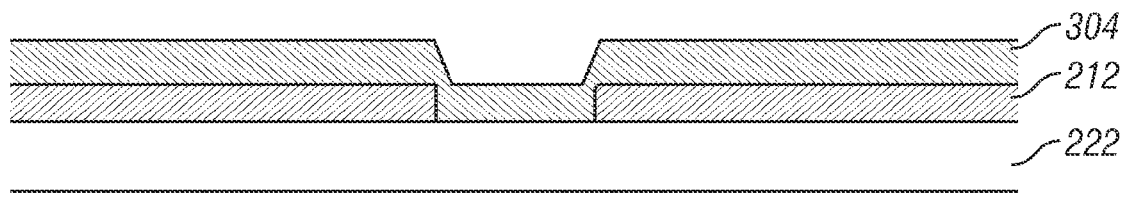
Figure 13D:
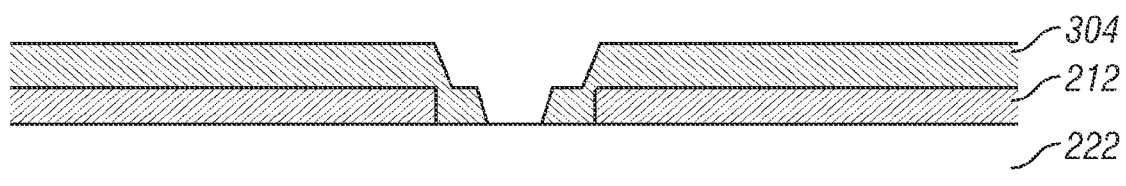
Figure 13E:
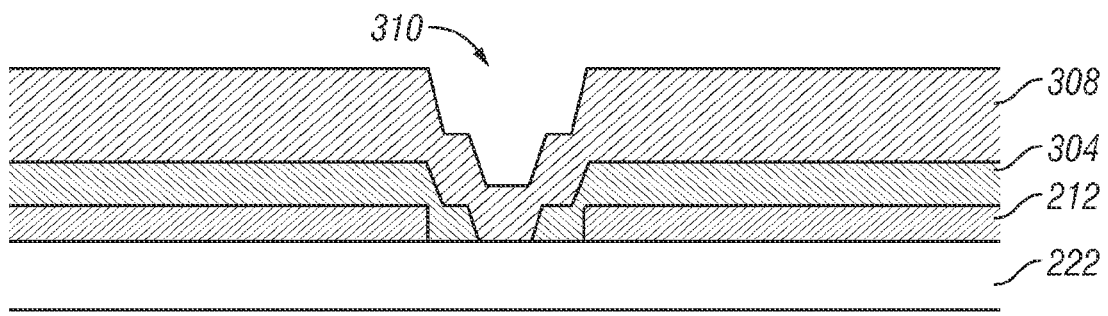

As is known in the MEMS device fabrication arts, additional or different processing steps and materials may be used to fabricate a MEMS device in accordance with certain embodiments disclosed herein. For example, FIGS. 13A-13L schematically illustrate a process flow that can be used to fabricate a MEMS device that is generally similar to the device 200 shown in FIGS. 11A and 11B. The processing steps schematically illustrated in FIGS. 13A-13E are substantially similar to the processing steps described with reference to FIGS. 12A-12E. In these steps, an electrode 212 is formed over a substrate 222. As described above, in some processes a partially reflective layer is formed on the electrode 212. The aperture 216 is formed in the electrode 212 (and the partially reflective layer, if present). The aperture 216 may extend completely through the electrode 212 as shown in FIG. 13B. First and second sacrificial layers 304 and 308 are deposited over the electrode 212. The second sacrificial layer 308 includes a region 310 that defines the shape of the stop member 208 (which is formed in a later processing step). The region 310 has a depth of about 1295 Å in one embodiment. The size and shape of the stop member 208 can be configured by suitably patterning and etching the region 310.

Figure 13F:
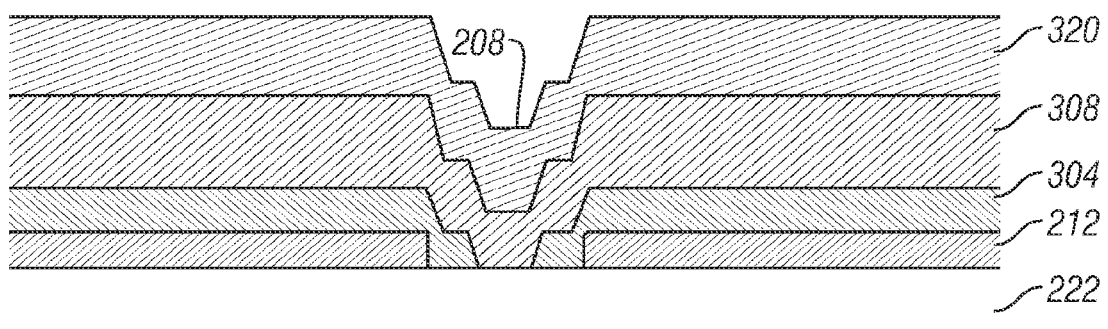
Figure 13G:
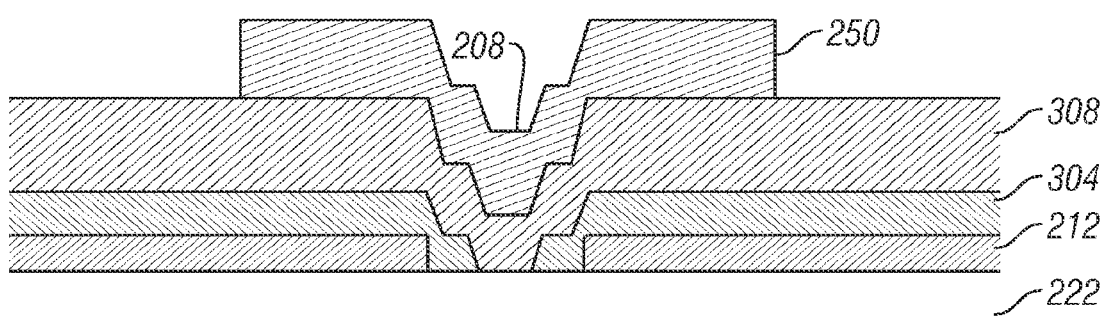
Figure 13H:
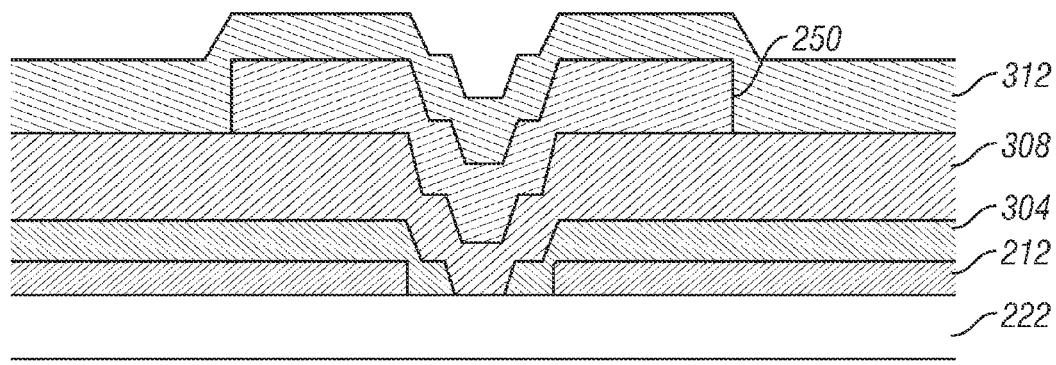

FIG. 13F schematically illustrates formation of a mirror layer 320 over the second sacrificial layer 308. The mirror layer 320 may be deposited as a conformal thin film and may comprise an electrically conductive and highly reflective material such as aluminum. The thickness of the mirror layer 320 may be in a range from about 300 Å to about 10000 Å and preferably may be about 5000 Å. The stop member 208 is formed by the material of the mirror layer 320 that fills (in whole or in part) the region 310. The mirror layer 320 is patterned and etched to produce a mirror 250 of suitable size as schematically illustrated in FIG. 13G. The reflective element 204 comprises a portion of the lower surface of the mirror 250 shown in FIG. 13G. A third sacrificial layer 312 is formed over the mirror 250 and portions of the second sacrificial layer 308 as schematically illustrated in FIG. 13H.

Figure 13I:
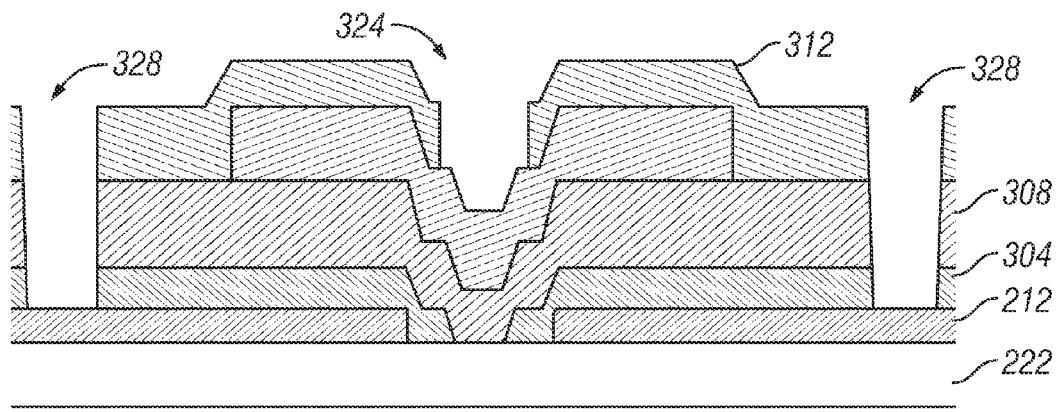
Figure 13J:
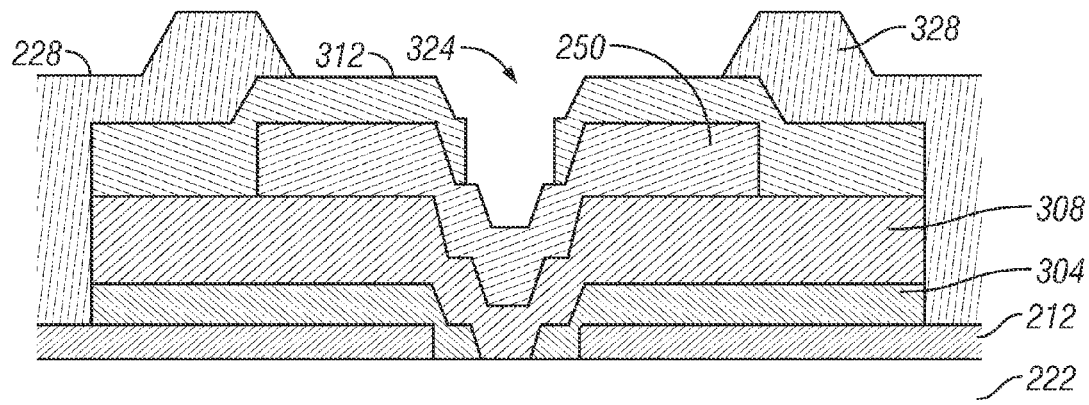

The first, second, and third sacrificial layers 304, 308, and 312 may be patterned and etched to form holes 328 as schematically shown in FIG. 13I, which may be filled with an electrically nonconductive material to form support posts 228 as schematically shown in FIG. 13J. FIG. 13J shows an embodiment in which the holes 328 extend through the first, second, and third sacrificial layers 304, 308, and 312 down to the electrode 212. In such embodiments, the support posts 228 are coupled to a surface of the electrode 212. However, in other embodiments, the holes 328 can be etched down to the substrate 222 so that the posts 228 are coupled thereto. The support posts 228 may be formed from a dielectric material such as aluminum oxide. In some embodiments, the support posts 228 are shaped by additional patterning and etching steps. FIGS. 13I and 13J also show a region 324 of the third sacrificial layer 312 that is patterned and etched to form a connector that mechanically couples the mirror 250 to the mechanical layer 226 (formed in a subsequent step).

Figure 13K:
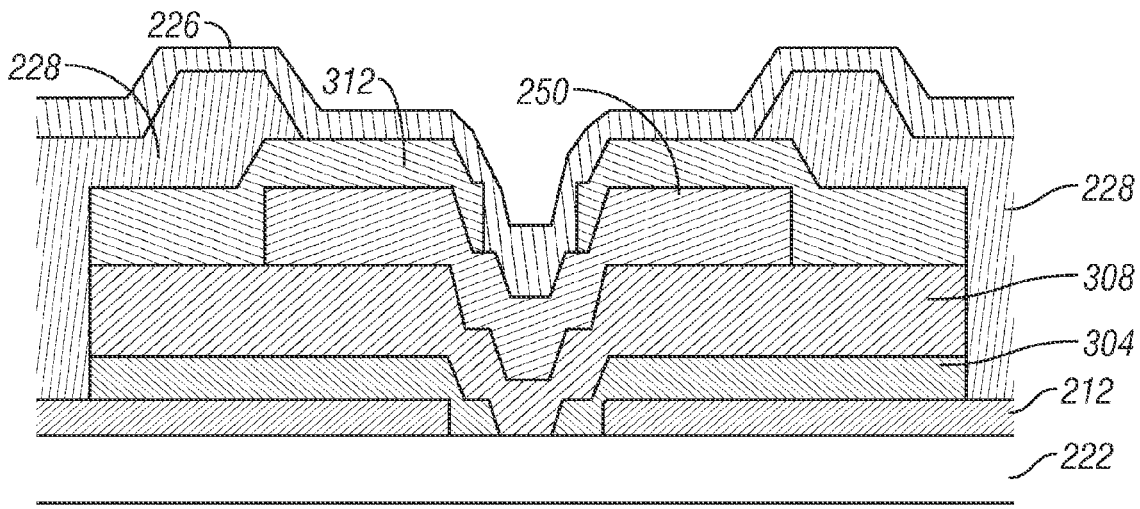
Figure 13L:
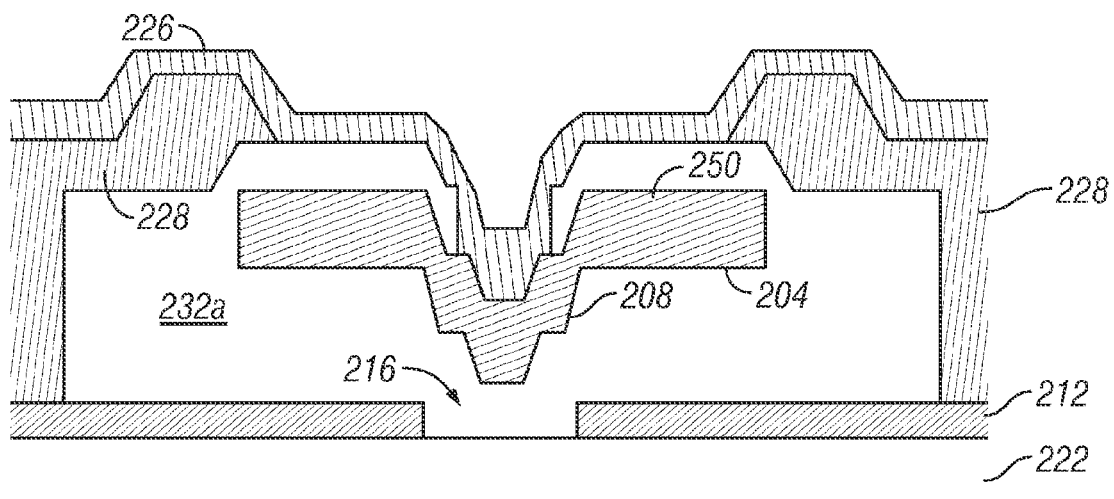

FIG. 13K schematically illustrates the formation of the mechanical layer 226 over the third sacrificial layer 312 and the support posts 228 (e.g., by deposition). An electrically conductive, mechanically deformable material such as aluminum may be used for the mechanical layer 226. In certain embodiments, the mechanical layer 226 is deposited as a conformal thin film over the third sacrificial layer 312. The first, second, and third sacrificial layers 304, 308, and 312 are removed (e.g., by etching) to produce the MEMS device schematically illustrated in FIG. 13L. As a result, the space filled by the sacrificial layers 304 and 308 becomes the interferometric cavity 232a of the completed MEMS device. The space filled by the third sacrificial layer 312 becomes a gap between the mechanical layer 226 and an upper surface of the mirror 250. Substances such as $XeF_2$, $F_2$, or HF may be used as the etchant, alone or in combination.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. An electromechanical device comprising:
a substrate;
a partially transparent or translucent and partially reflective electrode disposed over the substrate;
at least one aperture in the electrode extending at least partially through the electrode and having a boundary;
a reflective element comprising at least one stop member, wherein the electrode is disposed between the reflective element and the substrate, and wherein the at least one stop member extends toward one of the at least one aperture in the electrode;
an electrically nonconductive surface within the aperture or on a portion of the boundary; and
a support structure separating the reflective element from the electrode;
wherein the reflective element is configured to be movable between a first position and a second position, the stop member spaced from the electrically nonconductive surface when the reflective element is in the first position, and a portion of the stop member in contact with the electrically nonconductive surface when the reflective element is in the second position to stop the reflective element from contacting the electrically nonconductive surface except at the stop member portion of the reflective element and to electrically isolate the reflective element from the electrode when the reflective element is in the second position.

2. The device of claim 1, wherein the reflective element and the stop member are electrically conductive.

3. The device of claim 1, wherein the portion of the stop member has a width in a range from about 0.1 μm to about 4 μm.

4. The device of claim 1, wherein when the reflective element is in the second position, a gap between the electrode and the portion of the stop member is in a range from about 0.5 μm to about 2 μm.

5. The device of claim 1, wherein the aperture has a width in a range from about 0.1 μm to about 6 μm.

6. The device of claim 1, wherein a portion of the electrode is covered with a partially reflective layer.

7. The device of claim 1, wherein a portion of the electrode is covered with a passivation layer.

8. The device of claim 1, wherein the reflective element comprises a reflective surface facing toward the electrode and the stop member comprises a stop surface facing toward the electrically nonconductive surface, the stop surface positioned closer to the electrically nonconductive surface than is the reflective surface.

9. The device of claim 8, wherein the stop member extends toward the aperture by a length in a range from about 500 Å to about 2000 Å.

10. The device of claim 1, wherein at least one aperture extends completely through the electrode to expose the electrically nonconductive surface.

11. The device of claim 1, wherein the electrically nonconductive surface of the aperture comprises a portion of the substrate.

12. The device of claim 11, wherein the substrate comprises a dielectric material.

13. The device of claim 1, wherein the reflective element comprises at least a first stop member and a second stop member, and the device comprises at least a first aperture and a second aperture, the first aperture extending at least partially through the electrode and having a first boundary and the second aperture extending at least partially through the electrode and having a second boundary, the device further comprising a first electrically nonconductive surface within the first aperture or on a first portion of the first boundary and a second electrically nonconductive surface within the second aperture or on a second portion of the second boundary, and wherein, when the reflective element is in the second position, at least a first portion of the first stop member is in contact with the first electrically nonconductive surface and at least a second portion of the second stop member is in contact with the second electrically nonconductive surface.

14. The device of claim 1, wherein the support structure comprises a mechanical layer and wherein the reflective element comprises a portion of the mechanical layer.

15. The device of claim 1, wherein the support structure comprises a mechanical layer and wherein the reflective element is mechanically coupled to the mechanical layer.

16. The device of claim 1, wherein the support structure comprises a plurality of posts.

17. The device of claim 1, further comprising:
a display;
a processor that is configured to communicate with said display, said processor being configured to process image data; and
a memory device that is configured to communicate with said processor.

18. The device of claim 17, further comprising a driver circuit configured to send at least one signal to said display.

19. The device of claim 18, further comprising a controller configured to send at least a portion of said image data to said driver circuit.

20. The device of claim 17, further comprising an image source module configured to send said image data to said processor.

21. The device of claim 20, wherein said image source module comprises at least one of a receiver, transceiver, and transmitter.

22. The device of claim 17, further comprising an input device configured to receive input data and to communicate said input data to said processor.

23. An electromechanical device comprising:
a substrate;
means for reflecting light, the reflecting means comprising at least one means for stopping movement of the reflecting means;
means for conducting electricity, the conducting means partially transparent or translucent and partially reflective, the conducting means disposed over the substrate;
means for receiving the at least one stopping means, the receiving means having a boundary, the receiving means having an electrically nonconductive portion within the receiving means or on the boundary; and
means for separating the reflecting means and the conducting means, the conducting means disposed between the reflecting means and the substrate,
wherein the reflecting means is configured to be movable between a first position and a second position, the stopping means spaced from the electrically nonconductive portion when the reflecting means is in the first position, and a portion of the stopping means in contact with the electrically nonconductive portion when the reflecting means is in the second position to stop the reflecting means from contacting the electrically nonconductive portion except at the stopping means portion of the reflecting means and to electrically isolate the reflecting means from the conducting means when the reflecting means is in the second position.

24. The device of claim 23, wherein the reflecting means comprises a reflective element.

25. The device of claim 23, wherein the stopping means comprises at least one stop member.

26. The device of claim 23, wherein the reflecting means comprises a surface facing toward the conducting means and the stopping means comprises one or more portions of the surface facing toward the electrically nonconductive portion, the stopping means extending toward the receiving means wherein at least a portion of the stopping means is closer to the electrically nonconductive portion than is the reflecting means.

27. The device of claim 23, wherein the conducting means comprises an electrode.

28. The device of claim 27, wherein the receiving means comprises at least one aperture extending at least partially through the electrode.

29. The device of claim 28, wherein the electrically nonconductive portion of the receiving means comprises an electrically nonconductive surface within the aperture or on a portion of the boundary.

30. The device of claim 23, wherein the separating means comprises a support structure.

31. The device of claim 30, wherein the support structure comprises a mechanical layer and one or more posts.

\* \* \* \* \*